US012660196B2

(12) United States Patent
Choi et al.

(10) Patent No.: US 12,660,196 B2
(45) Date of Patent: Jun. 16, 2026

(54) THREE-DIMENSIONAL NON-VOLATILE MEMORY DEVICE

(71) Applicant: SAMSUNG ELECTRONICS CO., LTD., Suwon-si (KR)

(72) Inventors: Hyunmook Choi, Suwon-si (KR); Jihong Kim, Suwon-si (KR); Siyeon Cho, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 456 days.

(21) Appl. No.: 18/142,291

(22) Filed: May 2, 2023

(65) Prior Publication Data

US 2024/0040797 A1 Feb. 1, 2024

(30) Foreign Application Priority Data

Jul. 28, 2022 (KR) ........................ 10-2022-0094025

(51) Int. Cl.
H10B 51/30 (2023.01)
H10B 41/27 (2023.01)
(Continued)

(52) U.S. Cl.
CPC ............. H10B 51/30 (2023.02); H10B 41/27 (2023.02); H10B 41/30 (2023.02); H10B 41/35 (2023.02);
(Continued)

(58) Field of Classification Search
CPC ........ H10B 41/27; H10B 41/30; H10B 41/35; H10B 41/50; H10B 43/27; H10B 43/30;
(Continued)

(56) References Cited

U.S. PATENT DOCUMENTS 9,905,568 B2 2/2018 Son et al.
10,256,247 B1 * 4/2019 Kanakamedala ...... H10B 41/27
(Continued)

FOREIGN PATENT DOCUMENTS

KR 10-2017-0029795 A 3/2017
KR 10-2019-0105604 A 9/2019
(Continued)

OTHER PUBLICATIONS

Baxamusa et al., PCCP, vol. 11 (26), pp. 5205-5520 (Jul. 14, 2009).
(Continued)

*Primary Examiner* — Matthew E Warren
(74) *Attorney, Agent, or Firm* — Muir Patent Law, PLLC

(57) ABSTRACT

A three-dimensional non-volatile memory device includes horizontal word lines separated from each other in a vertical direction, horizontal ferroelectric layers arranged among the horizontal word lines, the horizontal ferroelectric layers including upper horizontal ferroelectric layers and lower horizontal ferroelectric layers, vertical ferroelectric layers contacting side walls of the horizontal ferroelectric layers and extending in the vertical direction, a semiconductor pillar passing through the horizontal word lines in the vertical direction, and a channel region between the horizontal word lines and the semiconductor pillar, wherein the upper horizontal ferroelectric layers and the lower horizontal ferroelectric layers are separated from each other by an air gap in the vertical direction.

20 Claims, 26 Drawing Sheets

(51) Int. Cl.

| | |
|---|---|
| *H10B 41/30* | (2023.01) |
| *H10B 41/35* | (2023.01) |
| *H10B 41/50* | (2023.01) |
| *H10B 43/27* | (2023.01) |
| *H10B 43/30* | (2023.01) |
| *H10B 43/35* | (2023.01) |
| *H10B 43/50* | (2023.01) |
| *H10B 51/10* | (2023.01) |
| *H10B 51/20* | (2023.01) |
| *H10B 53/10* | (2023.01) |
| *H10B 53/20* | (2023.01) |
| *H10B 53/30* | (2023.01) |

(52) U.S. Cl.
CPC ............. *H10B 41/50* (2023.02); *H10B 43/27* (2023.02); *H10B 43/30* (2023.02); *H10B 43/35* (2023.02); *H10B 43/50* (2023.02); *H10B 51/10* (2023.02); *H10B 51/20* (2023.02); *H10B 53/10* (2023.02); *H10B 53/20* (2023.02); *H10B 53/30* (2023.02)

(58) Field of Classification Search
CPC ........ H10B 43/35; H10B 43/50; H10B 51/10; H10B 51/20; H10B 53/30; H10B 53/10; H10B 53/20
See application file for complete search history.

(56) References Cited

U.S. PATENT DOCUMENTS

| | | | | |
|---|---|---|---|---|
| 10,438,671 | B1 * | 10/2019 | Chen ...................... | G11C 16/08 |
| 11,362,143 | B2 | 6/2022 | Han et al. | |

| | | | | |
|---|---|---|---|---|
| 2016/0064532 | A1 * | 3/2016 | Makala ............... | H01L 21/7682 438/266 |
| 2016/0181259 | A1 | 6/2016 | Van Houdt et al. | |
| 2020/0127002 | A1 * | 4/2020 | Park ......................... | G11C 5/06 |
| 2020/0227727 | A1 | 7/2020 | Li | |
| 2020/0411554 | A1 | 12/2020 | Zhang et al. | |
| 2021/0036018 | A1 | 2/2021 | Rajashekhar et al. | |
| 2021/0050371 | A1 * | 2/2021 | Sharangpani .......... | H10B 51/20 |
| 2021/0242241 | A1 * | 8/2021 | Rajashekhar .......... | H10B 41/10 |
| 2021/0399017 | A1 | 12/2021 | Sun et al. | |
| 2023/0018394 | A1 * | 1/2023 | Makala ................ | H10D 62/115 |
| 2023/0206976 | A1 * | 6/2023 | Lee ..................... | G11C 11/2257 257/295 |
| 2024/0005991 | A1 * | 1/2024 | Suzuki ................... | H10B 41/35 |

FOREIGN PATENT DOCUMENTS

| | | | | |
|---|---|---|---|---|
| KR | 20190123163 A | * 10/2019 | ........ | H01L 27/11536 |
| KR | 10-2021-0103305 A | 8/2021 | | |
| KR | 1020210132483 A | 11/2021 | | |
| KR | 20230125694 A | * 8/2023 | ............. | H10B 43/27 |

OTHER PUBLICATIONS

Chan et al., J. Electrochem. Soc, vol. 153, C223 (2006).
Huang et al., IEEE Transactions on Device and Materials Reliability, vol. 15 (1) (Mar. 2015).
Onaya et al, Micrelectronic Engineering, vol. 215, 111013 (2019).
Persson et al., Appl. Phys. Lett., vol. 116, 062902 (2020).

* cited by examiner

THREE-DIMENSIONAL NON-VOLATILE MEMORY DEVICE

CROSS-REFERENCE TO RELATED APPLICATION

This application is based on and claims priority under 35 U.S.C. § 119 to Korean Patent Application No. 10-2022-0094025, filed on Jul. 28, 2022, in the Korean Intellectual Property Office, the disclosure of which is incorporated by reference herein in its entirety.

BACKGROUND

1. Field

Embodiments relate to a memory device, and more particularly, to a three-dimensional (3D) non-volatile memory device including a plurality of memory cells repeatedly arranged in three dimensions.

2. Description of the Related Art

To increase the integration density of non-volatile memory devices, cell transistors may be stacked on one another in a vertical direction. In particular, in the case of NAND flash memory devices among non-volatile memory devices, a single cell is constituted of a single transistor, and accordingly, the integration density thereof may be increased by vertically stacking cell transistors. However, when cell transistors of non-volatile memory devices are stacked in the vertical direction, it is necessary to improve the operating characteristics of the cell transistors.

SUMMARY

According to an aspect of embodiments, there is provided a three-dimensional non-volatile memory device including horizontal word lines separated from each other in a vertical direction, horizontal ferroelectric layers arranged among the horizontal word lines, the horizontal ferroelectric layers including upper horizontal ferroelectric layers and lower horizontal ferroelectric layers, vertical ferroelectric layers contacting side walls of the horizontal ferroelectric layers and extending in the vertical direction, a semiconductor pillar passing through the horizontal word lines in the vertical direction, and a channel region between the horizontal word lines and the semiconductor pillar, wherein the upper horizontal ferroelectric layers and the lower horizontal ferroelectric layers are separated from each other by an air gap in the vertical direction.

According to another aspect of embodiments, there is provided a three-dimensional non-volatile memory device including horizontal word lines separated from each other in a vertical direction, horizontal ferroelectric layers arranged among the horizontal word lines, the horizontal ferroelectric layers including upper horizontal ferroelectric layers and lower horizontal ferroelectric layers, vertical ferroelectric layers contacting side walls of the horizontal ferroelectric layers and extending in the vertical direction, horizontal insulating patterns arranged among the horizontal ferroelectric layers, the horizontal insulating patterns including upper horizontal insulating patterns and lower horizontal insulating patterns, a semiconductor pillar passing through the horizontal word lines in the vertical direction, a channel region between the horizontal word lines and the semiconductor pillar, and vertical insulating patterns between the vertical ferroelectric layers and the channel region, wherein the upper horizontal insulating patterns and the lower horizontal insulating patterns are separated from each other by an air gap in the vertical direction.

According to a further aspect of embodiments, there is provided a three-dimensional non-volatile memory device including a substrate having a main surface, horizontal word lines above the substrate, the horizontal word lines extending in a horizontal direction and separated from each other in a vertical direction, the horizontal direction being parallel with the main surface of the substrate, and the vertical direction being perpendicular to the main surface of the substrate, horizontal insulating patterns extending in the horizontal direction, horizontal ferroelectric layers extending in the horizontal direction above the substrate, the horizontal ferroelectric layers being arranged among the horizontal word lines and including upper horizontal ferroelectric layers and lower horizontal ferroelectric layers, vertical ferroelectric layers contacting side walls of the horizontal ferroelectric layers, extending in the vertical direction, and connecting with the horizontal ferroelectric layers, a word line cut passing through the horizontal word lines in the vertical direction, a through hole separated from the word line cut in the horizontal direction, the through hole including a semiconductor pillar passing through the horizontal word lines in the vertical direction and a channel region between the horizontal word lines and the semiconductor pillar, and vertical insulating patterns between the horizontal word lines and the through hole, wherein the upper horizontal ferroelectric layers and the lower horizontal ferroelectric layers are separated from each other by an air gap in the vertical direction.

BRIEF DESCRIPTION OF THE DRAWINGS

Features will become apparent to those of skill in the art by describing in detail exemplary embodiments with reference to the attached drawings, in which:

FIGS. 1 and 2 are circuit diagrams of a three-dimensional (3D) non-volatile memory device according to an embodiment;

FIGS. 7A to 7I are cross-sectional views of stages in a method of manufacturing a 3D non-volatile memory device, according to an embodiment;

DETAILED DESCRIPTION

A three-dimensional (3D) non-volatile memory device has a characteristic of retaining data stored therein even when power is not supplied thereto. A NAND flash memory device is described as an example of a 3D non-volatile memory device. Accordingly, embodiments may be directly applied to a NAND flash memory device.

Figure 1:
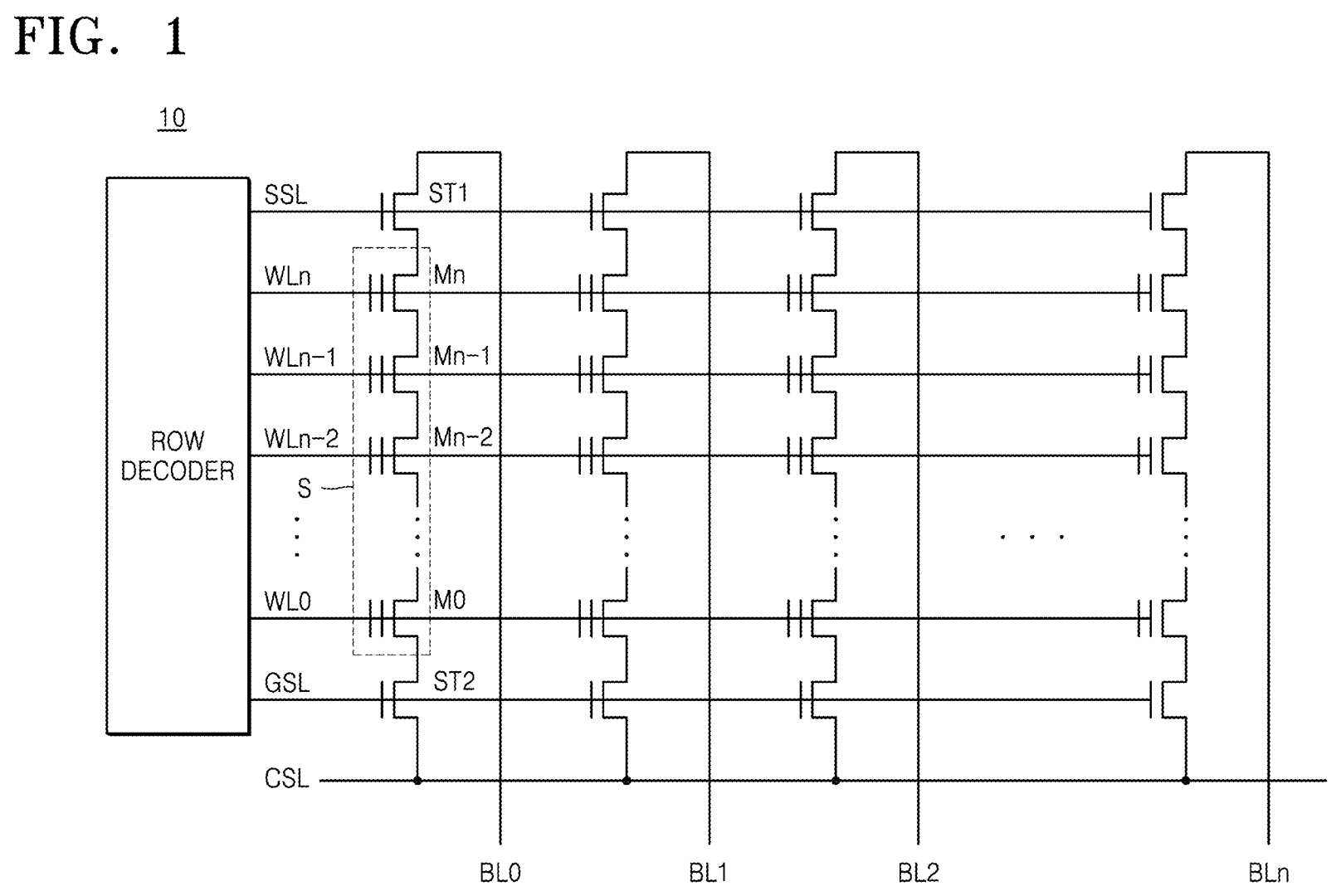
Figure 2:
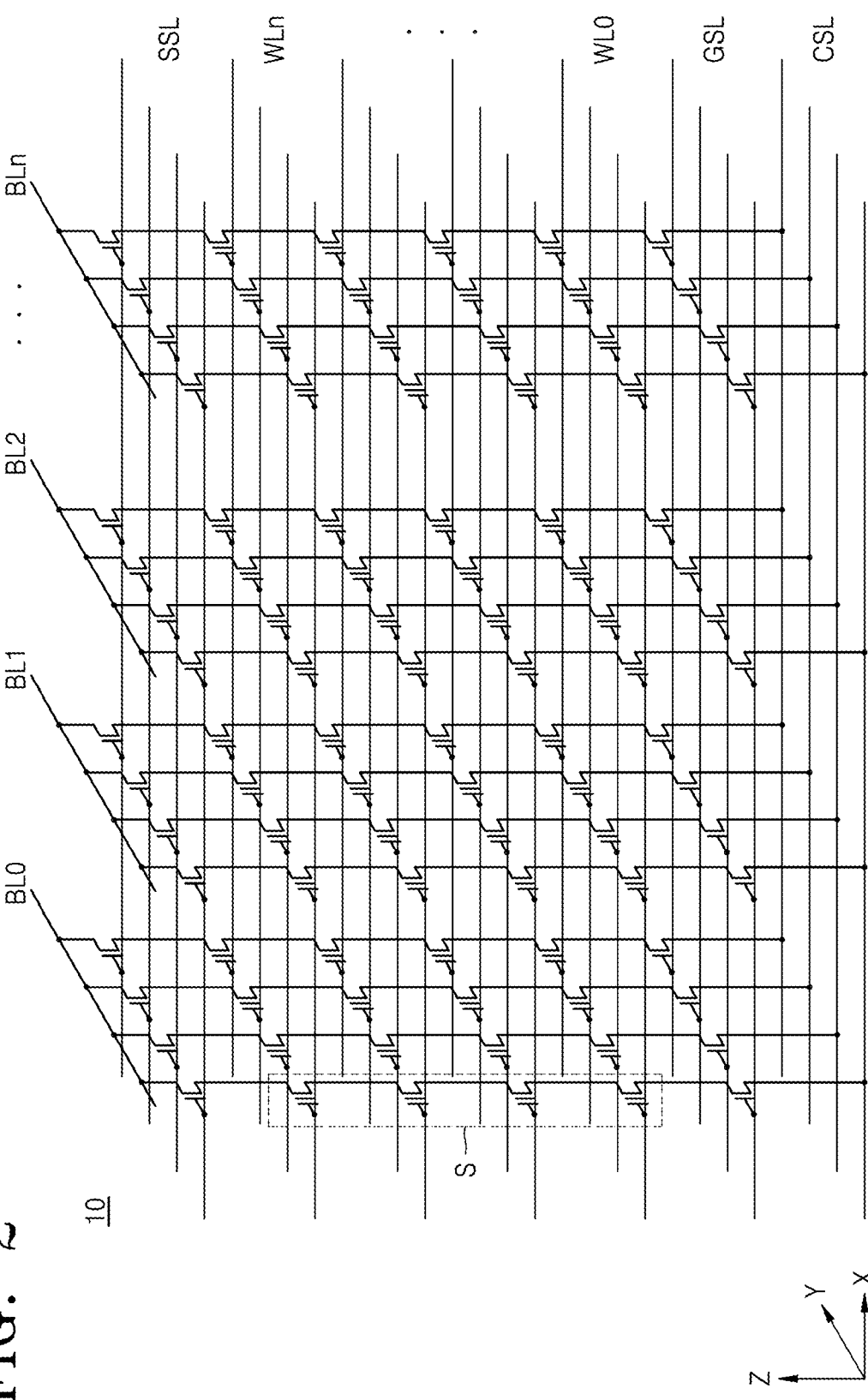

FIGS. 1 and 2 are circuit diagrams of a 3D non-volatile memory device according to an embodiment.

In detail, FIGS. 1 and 2 are respectively a two-dimensional (2D) circuit diagram and a 3D circuit diagram of a 3D non-volatile memory device 10, i.e., a NAND flash memory device. In the 3D non-volatile memory device 10, N+1 cell transistors M0 to Mn may be connected in series to each other and form a cell string S. Cell strings S may be connected in parallel between bit lines BL0 to BLn and a ground select line GSL.

The 3D non-volatile memory device 10 may include the cell string S, in which the cell transistors M0 to Mn are connected in series to each other, horizontal word lines WL0 to WLn for respectively selecting the cell transistors M0 to Mn, and a row decoder driving the horizontal word lines WL0 to WLn.

The 3D non-volatile memory device 10 may include a string select line SSL which is connected to a side of the cell string S and includes a string select transistor ST1, the bit lines BL0 to BLn, each of which is connected to a drain of the string select transistor ST1, and the ground select line GSL which is connected to an opposite side of the cell string S and includes a ground select transistor ST2. In the 3D non-volatile memory device 10, a common source line CSL is connected to a source of the ground select transistor ST2.

In the 3D non-volatile memory device 10, a string may be constituted of the cell string S and the string select transistor ST1 and the ground select transistor ST2, which are respectively connected to the top and bottom of the cell string S. Although it is illustrated in FIGS. 1 and 2 that a string is formed by connecting the string select transistor ST1 and the ground select transistor ST2 to the cell string S, there may be two or more string select transistors ST1 and two or more ground select transistors ST2.

The cell string S may include 2m cell transistors M0 to Mn, where "m" is a natural number greater than or equal to 1. Two, four, eight, or sixteen cell transistors M0 to Mn may be connected in series to one another in the cell string S. For convenience, only four of the cell transistors M0 to Mn and only four of the horizontal word lines WL0 to WLn are illustrated in FIGS. 1 and 2.

In FIG. 2, a first horizontal direction (an X direction) may be a horizontal word line direction in which the horizontal word lines WL0 to WLn extend. A second horizontal direction (a Y direction) may be a bit line direction in which the bit lines BL0 to BLn extend. A vertical direction (a Z direction) may be perpendicular to the horizontal word lines WL0 to WLn and the bit lines BL0 to BLn.

Each of the horizontal word lines WL0 to WLn, the bit lines BL0 to BLn, and the common source line CSL may include a metal, a conductive metal nitride, a conductive semiconductor material, or a combination thereof. In some embodiments, each of the horizontal word lines WL0 to WLn, the bit lines BL0 to BLn, and the common source line CSL may include W, Al, Cu, Co, Mo, Ti, Ta, TiN, TaN, WN, WCN, TiSiN, TaSiN, WSiN, or a combination thereof.

Figure 3:
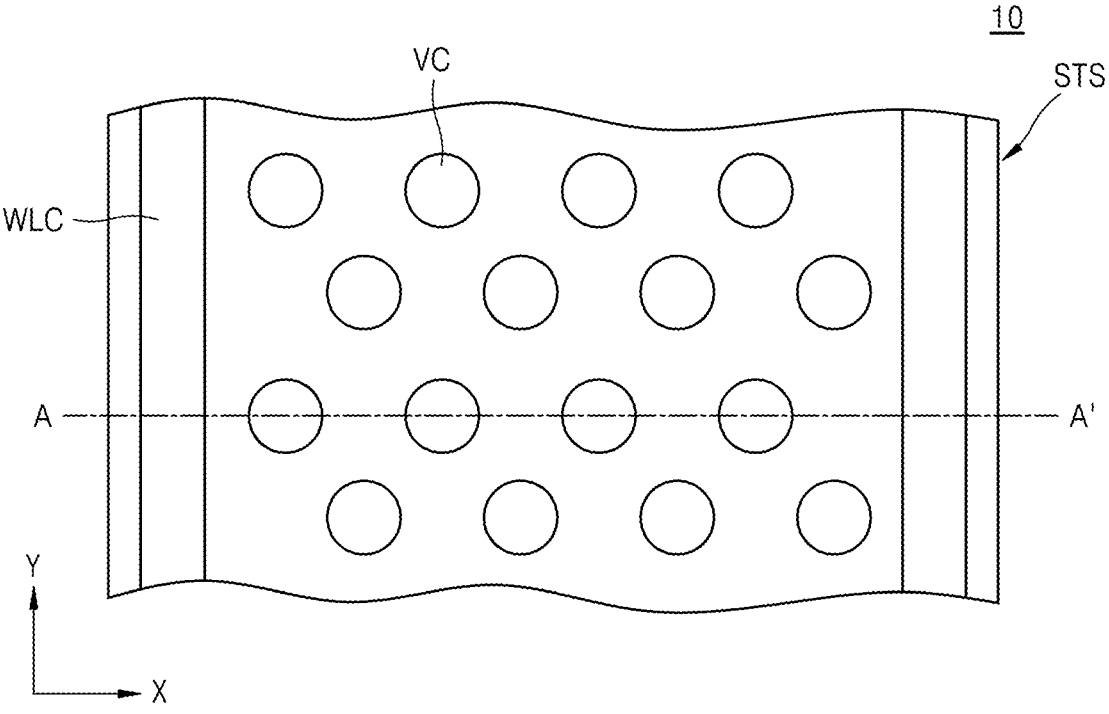
FIG. 3 is a plan view of a main portion of a cell transistor of a 3D non-volatile memory device, according to an embodiment.

FIG. 3 is a plan view of a main portion of a cell transistor of a 3D non-volatile memory device, according to an embodiment.

In detail, the 3D non-volatile memory device 10 may include a plurality of stack bodies STS, which are above a substrate 202 (in FIG. 4) and are separated from each other. Each of the stack bodies STS may be formed in a horizontal plane (an X-Y plane).

Each stack body STS may include a through hole VC and a word line cut WLC, which are separated from each other. The through hole VC and/or the word line cut WLC may pass through the top and bottom surfaces of the stack body STS.

A plurality of through holes VC may be arranged between word line cuts WLC of the stack body STS. Although it is illustrated in FIG. 3 that four through holes VC are arranged in line in the first horizontal direction (the X direction) between two adjacent word line cuts WLC, the number of through holes VC between the word line cuts WLC is not limited thereto, e.g., at most three or at least five through holes VC may be arranged between the word line cuts WLC.

As described below, cell transistors of the 3D non-volatile memory device 10 may be formed in the through holes VC. A channel region 250 and a semiconductor pillar 274 may be in each of the through holes VC (FIG. 4), and vertical ferroelectric layers 243 may be in each of the word line cuts WLC (FIG. 4).

Figure 4:
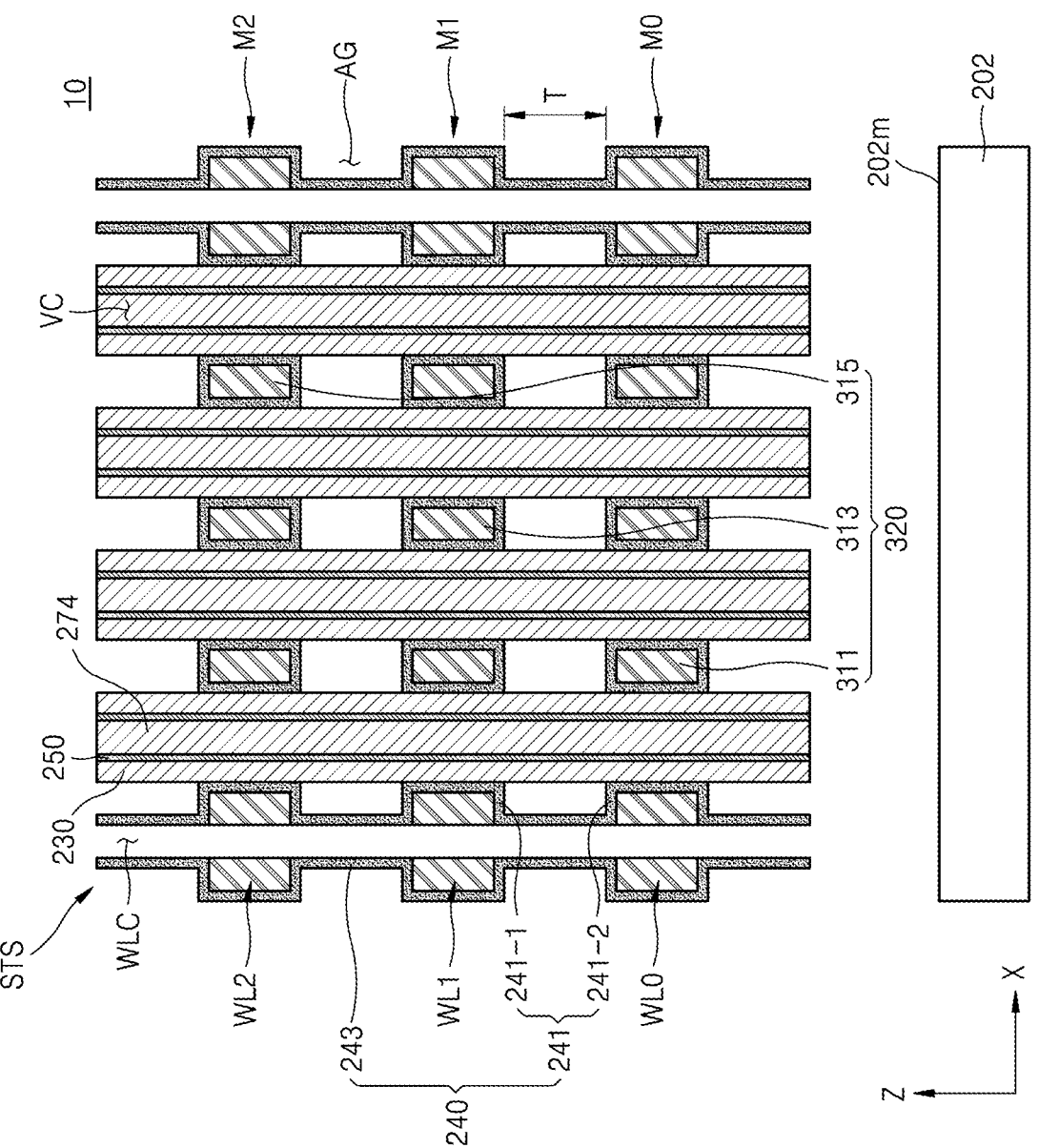
FIG. 4 is a cross-sectional view along line A-A' in FIG. 3, according to an embodiment.

FIG. 4 is a cross-sectional view of the 3D non-volatile memory device, taken along line A-A' in FIG. 3, according to an embodiment. For convenience, FIG. 4 illustrates three horizontal word lines WL0, WL1, and WL2 and three cell transistors M0, M1, and M2.

Referring to FIG. 4, the 3D non-volatile memory device 10 may include the stack body STS on the substrate 202. The stack body STS may include a ferroelectric layer 240, the channel region 250, the semiconductor pillar 274, and horizontal word lines 320.

In detail, the stack body STS may include horizontal ferroelectric layers 241 and the horizontal word lines 320, which are alternately stacked above the substrate 202. Each of the horizontal ferroelectric layers 241 may include a lower horizontal ferroelectric layer 241-1 and an upper horizontal ferroelectric layer 241-2, and the horizontal word lines 320 may include first to third horizontal word lines 311, 313, and 315. For example, as illustrated in FIG. 4, one horizontal ferroelectric layer 241 may be between the first and second horizontal word lines 311 and 313, with the lower horizontal ferroelectric layer 241-1 contacting the lower surface of the second horizontal word line 313 and the upper horizontal ferroelectric layer 241-2 contacting the upper surface of the first horizontal word line 311. For example, as illustrated in FIG. 4, the lower horizontal ferroelectric layer 241-1 and the upper horizontal ferroelectric layer 241-2 of a same horizontal ferroelectric layer 241 may be in, e.g., direct, contact with different horizontal word lines 320, respectively, that are adjacent to each other in the vertical direction (the Z direction).

The substrate 202 may include a monocrystalline semiconductor material. For example, the substrate 202 may include a monocrystalline silicon substrate. The monocrystalline silicon substrate may refer to a monocrystalline silicon wafer, e.g., a P-type monocrystalline silicon wafer. An impurity region, e.g., an N-type impurity region, and the common source line CSL (in FIGS. 1 and 2) may be formed in the substrate 202, as described above.

The stack body STS may include the word line cuts WLC and the through holes VC, which extend in a stack direction, i.e., the vertical direction (the Z direction), in the horizontal word lines 320. The stack body STS may also include a vertical insulating pattern 230 and the ferroelectric layer 240. The stack direction, i.e., the vertical direction (the Z direction), may be a direction, in which the horizontal word lines 320 are stacked on one another.

The vertical insulating pattern 230 may be between a through hole VC and a vertical ferroelectric layer 243. The vertical insulating pattern 230 may extend in the vertical direction (the Z direction) above the substrate 202. For example, the vertical insulating pattern 230 may include monocrystalline silicon and/or silicon oxide. A side surface of the vertical insulating pattern 230 may be in, e.g., direct, contact with the vertical ferroelectric layers 243, and another side surface of the vertical insulating pattern 230 may be in, e.g., direct, contact with the channel region 250. In other words, the vertical insulating pattern 230 may be between the channel region 250 and the vertical ferroelectric layers 243. The vertical insulating pattern 230 may insulate, e.g., completely separate, the channel region 250 from the vertical ferroelectric layers 243.

The ferroelectric layers 240 may include horizontal ferroelectric layers 241 and vertical ferroelectric layers 243. The horizontal ferroelectric layers 241 may extend in the horizontal direction (the X direction and/or the Y direction), and the vertical ferroelectric layers 243 may extend in the vertical direction (the Z direction). Here, a direction parallel with a main surface 202m of the substrate 202 may be defined as the horizontal direction (the X direction and/or the Y direction), and a direction perpendicular to the main surface 202m of the substrate 202 may be defined as the vertical direction (the Z direction).

As described above, the horizontal ferroelectric layers 241 may include the lower horizontal ferroelectric layers 241-1 and the upper horizontal ferroelectric layers 241-2. The ferroelectric layers 240 may surround the horizontal word lines 320. In other words, the horizontal ferroelectric layers 241 and the vertical ferroelectric layers 243 may surround the horizontal word lines 320. For example, as illustrated in FIG. 4, the horizontal ferroelectric layers 241 may extend in the horizontal direction on horizontal surfaces of the horizontal word lines 320 to, e.g., completely, cover the horizontal surfaces of the horizontal word lines 320, while the vertical ferroelectric layers 243 may extend from the horizontal ferroelectric layers 241 in the vertical direction on vertical surfaces of the horizontal word lines 320 to, e.g., completely, cover the vertical surfaces of the horizontal word lines 320.

In detail, the top surface of a lower horizontal ferroelectric layer 241-1 may be in, e.g., direct, contact with the bottom surface of a horizontal word line 320, and the bottom surface of an upper horizontal ferroelectric layer 241-2 may be in, e.g., direct, contact with the top surface of an adjacent horizontal word line 320 (i.e., an adjacent underlying word line 320). For example, as illustrated in FIG. 4, the lower horizontal ferroelectric layer 241-1 and the upper horizontal ferroelectric layer 241-2 may be in direct contact with different horizontal word lines 320 that are adjacent to each other in the vertical direction (the Z direction). The lower horizontal ferroelectric layers 241-1 and the upper horizontal ferroelectric layers 241-2 may be separated from each other in the vertical direction (the Z direction). For example, the lower horizontal ferroelectric layer 241-1 and the upper horizontal ferroelectric layer 241-2 (of a same horizontal ferroelectric layer 241) may be separated from each other by an air gap AG in the vertical direction (the Z direction). A thickness T of the air gap AG may be less than or equal to about 15 nm. The air gap AG may be between horizontal ferroelectric layers of a same horizontal ferroelectric layer 241 that is between adjacent horizontal word lines 320, and may provide a vertical distance between the horizontal ferroelectric layers 241.

The vertical ferroelectric layers 243 may be in word line cuts WLC. The vertical ferroelectric layers 243 in the word line cuts WLC may be separated from the vertical insulating pattern 230 in the first horizontal direction (the X direction). For example, the vertical ferroelectric layers 243 in the word line cut WLC may be separated from the vertical insulating pattern 230 by the air gap AG in the first horizontal direction (the X direction). The vertical ferroelectric layers 243 may be arranged to zigzag in the vertical direction (the Z direction), e.g., so some portions of the vertical ferroelectric layers 243 are separated from the vertical insulating pattern 230 by the air gap AG and other portions of the vertical ferroelectric layers 243 contact the vertical insulating pattern 230.

A plurality of vertical insulating patterns 230 between neighboring through holes VC may be separated from each other in the horizontal direction (the X direction and/or the Y direction). For example, the vertical insulating patterns 230 between neighboring through holes VC may be separated from each other by the air gap AG in the horizontal direction (the X direction and/or the Y direction). The term "air" used herein may refer to the atmosphere or other gases that may exist in manufacturing processes.

The horizontal ferroelectric layers 241 may be electrically connected to the vertical ferroelectric layers 243. For example, the vertical ferroelectric layers 243 in the word line cut WLC may be electrically connected to each other by the horizontal ferroelectric layers 241 respectively contacting the top and bottom surfaces of the horizontal word lines 320.

In some embodiments, the ferroelectric layers 240 may include at least one oxide of, e.g., Hf, Si, Al, Zr, Y, La, Gd, and Sr. For example, the ferroelectric layers 240 may include hafnium-based oxide, e.g., hafnium oxide (HfO), hafnium zirconium oxide (HfZO), hafnium titanium oxide, or hafnium silicon oxide. The ferroelectric layers 240 may further include a dopant in some embodiments. The dopant may be constituted of at least one element of, e.g., Si, Al, Zr, Y, La, Gd, Sc, Sr, Mg, and Ba. In some embodiments, the ferroelectric layers 240 may be constituted of a stack structure including a plurality of ferroelectric sub layers of different materials. In some embodiments, the ferroelectric layers 240 may be constituted of a stack structure including at least one ferroelectric sub layer and a dielectric layer. The material of each ferroelectric sub layer may be of the materials of the ferroelectric layers 240, which have been described above. The dielectric layer may include, e.g., a silicon oxide film, a high-k dielectric film, or a combination thereof. The high-k dielectric film may include metal oxide or metal oxynitride, which has a greater dielectric constant than a silicon oxide film.

The channel region 250 and the semiconductor pillar 274 may be in each through hole VC. In a plan view, the channel region 250 may surround the semiconductor pillar 274. The channel region 250 and the semiconductor pillar 274 may vertically extend above the substrate 202.

In some embodiments, a plurality of channel regions 250 may include, e.g., undoped polysilicon, doped polysilicon, a compound semiconductor material, an oxide semiconductor material, a 2D semiconductor material, or a combination thereof. The compound semiconductor material may be at least one of, e.g., a Group IV-IV compound semiconductor, a Group III-V compound semiconductor, a Group II-VI compound semiconductor, and a Group IV-VI compound semiconductor. The Group IV-IV compound semiconductor may include, e.g., SiGe, SiC, SiGeC, GeSn, SiSn, and SiGeSn. The Group III-V compound semiconductor may be constituted of a compound semiconductor including, as a Group III element, at least one element of, e.g., In, Ga, and Al and, as a Group V element, at least one element of, e.g., As, P, and Sb. The Group III-V compound semiconductor may be constituted of a binary, ternary, or quaternary compound including two, three, or four elements from Groups III and V. The binary compound may be, e.g., InP, GaAs, GaP, InAs, InSb, or GaSb, and the ternary compound may be, e.g., InGaP, InGaAs, AlInAs, InGaSb, GaAsSb, of GaAsP. The Group II-VI compound semiconductor may be constituted of a binary, ternary, or quaternary compound including two, three, or four elements selected from Groups II and VI. The Group II-VI compound semiconductor may be, e.g., CdSe, ZnTe, CdS, ZnS, ZnSe, or HgCdTe. The Group IV-VI compound semiconductor may be constituted of Pb S.

The oxide semiconductor material may be, e.g., InGaZnO (IGZO), Sn-IGZO, InWO (IWO), InZnO (IZO), ZnSnO (ZTO), ZnO, yttrium-doped zinc oxide (YZO), InGaSiO (IGSO), InO, SnO, TiO, ZnON, MgZnO, ZrInZnO, HfIn-ZnO, SnInZnO, AlSnInZnO, SiInZnO, AlZnSnO, GaZnSnO, or ZrZnSnO.

In some embodiments, the 2D semiconductor material may be constituted of transition metal dichalcogenide or a bipolar semiconductor material using both an electron and a hole as driving charge. For example, the 2D semiconductor material may be $MoS_2$, $MoSe_2$, $WS_2$, $NbS_2$, $TaS_2$, $ZrS_2$, $HfS_2$, $TcS_2$, $ReS_2$, $CuS_2$, $GaS_2$, $InS_2$, $SnS_2$, $GeS_2$, $PbS_2$, $WSe_2$, $NbSe_2$, $TaSe_2$, $ZrSe_2$, $HfSe_2$, $TcSe_2$, $ReSe_2$, $CuSe_2$, $GaSe_2$, $InSe_2$, $SnSe_2$, $GeSe_2$, $PbSe_2$, $MoTe_2$, $WTe_2$, $NbTe_2$, $TaTe_2$, $ZrTe_2$, $HfTe_2$, $TcTe_2$, $ReTe_2$, $CuTe_2$, $GaTe_2$, $InTe_2$, $SnTe_2$, $GeTe_2$, or $PbTe_2$.

Each of the terms of the materials listed herein indicates a material composed of elements included in each term and is not a chemical equation representing stoichiometric relationships.

The semiconductor pillar 274 may provide an active region of the 3D non-volatile memory device 10. The semiconductor pillar 274 may correspond to a cylindrical-shaped or a pillar-shaped semiconductor pattern above the substrate 202. The semiconductor pillar 274 may include the same material as the vertical insulating pattern 230.

In general, 3D memory devices have relatively high cell-to-cell interference because horizontal word lines and/or a horizontal insulating pattern are not separated from each other in the vertical direction. In contrast, according to the present embodiment, the 3D non-volatile memory device 10 has relatively low cell-to-cell interference because the horizontal ferroelectric layers 241 among the horizontal word lines 320 are separated from each other by the air gap AG. Accordingly, the cell transistors M0 to Mn may provide improved operating characteristics. For example, a fault (e.g., disturbance) between word lines in the cell strings S may decrease.

Figure 5:
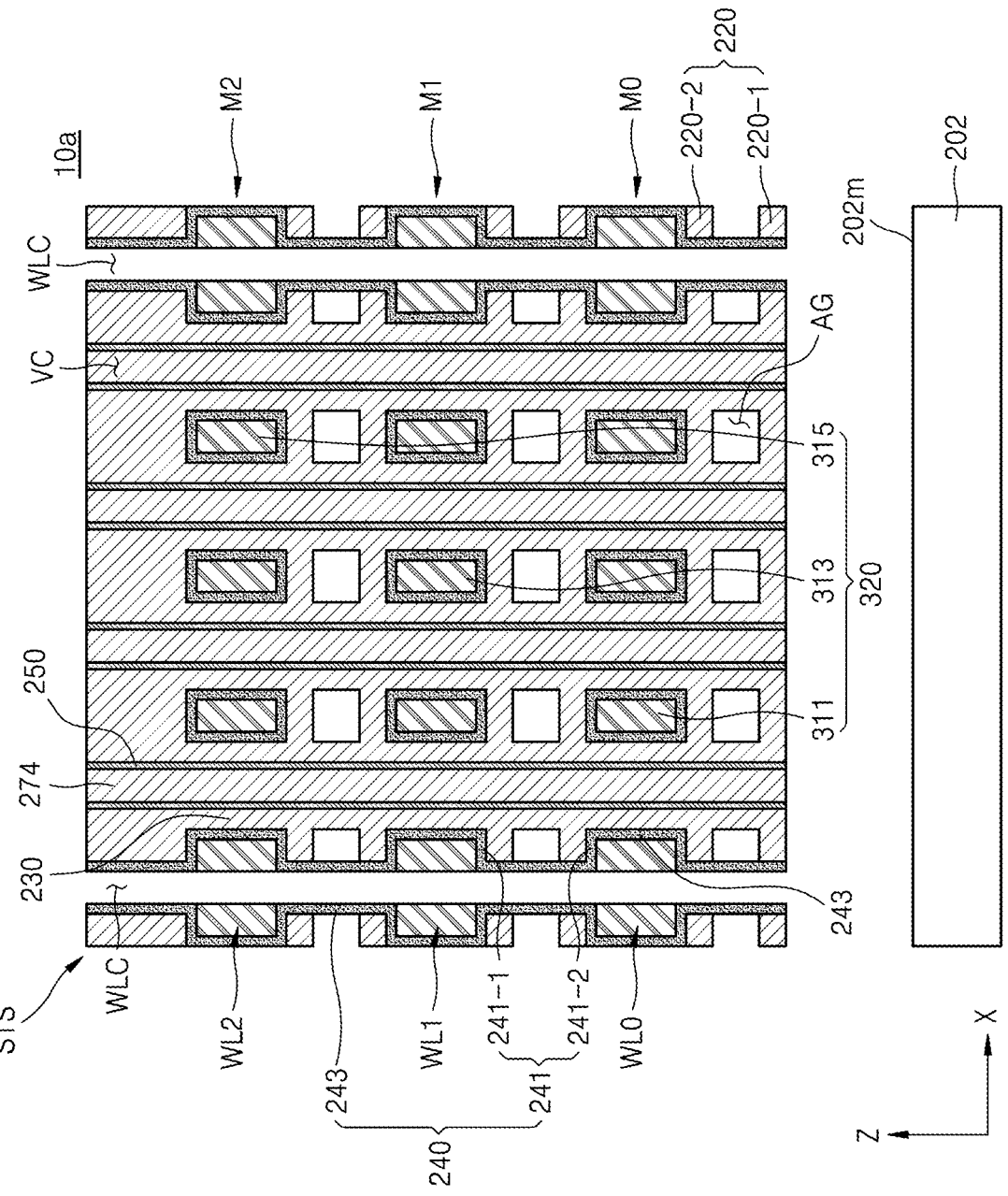
FIG. 5 is a cross-sectional view along line A-A' in FIG. 3, according to an embodiment.

FIG. 5 is a cross-sectional view of a 3D non-volatile memory device, taken along line A-A' in FIG. 3, according to an embodiment. For convenience, a 3D non-volatile memory device 10a of FIG. 5 is illustrated with three horizontal word lines WL0, WL1, and WL2 and three cell transistors M0, M1, and M2.

Referring to FIG. 5, the 3D non-volatile memory device 10a may include the stack body STS, the substrate 202, the ferroelectric layer 240, the channel region 250, the semiconductor pillar 274, and the horizontal word lines 320, as the 3D non-volatile memory device 10 of FIG. 4. Further, the 3D non-volatile memory device 10a may include a horizontal insulating pattern 220.

The horizontal insulating pattern 220 may include a lower horizontal insulating pattern 220-1 and an upper horizontal insulating pattern 220-2. The horizontal insulating pattern 220 may extend in the horizontal direction (the X direction and/or the Y direction) and may be between the vertical ferroelectric layer 243 in the word line cut WLC and the vertical insulating pattern 230. The side surface of the horizontal insulating pattern 220 may be in contact with the vertical ferroelectric layer 243 and/or the vertical insulating pattern 230. The bottom surface of the lower horizontal insulating pattern 220-1 may be in contact with the top surface of the upper horizontal ferroelectric layers 241-2, and the top surface of the upper horizontal insulating pattern 220-2 may be in contact with the bottom surface of the lower horizontal ferroelectric layer 241-1.

The lower horizontal insulating pattern 220-1 and the upper horizontal insulating pattern 220-2 may be separated from each other in the vertical direction (the Z direction). For example, the lower horizontal insulating pattern 220-1 and the upper horizontal insulating pattern 220-2 may be separated from each other by the air gap AG in the vertical direction (the Z direction). The vertical ferroelectric layers 243 in the word line cut WLC may be separated from the vertical insulating pattern 230 in the horizontal direction (the X direction and/or the Y direction). For example, the vertical ferroelectric layers 243 in the word line cut WLC may be separated from the vertical insulating pattern 230 by the air gap AG in the horizontal direction (the X direction and/or the Y direction).

FIGS. 6A to 6I are cross-sectional views of stages in a method of manufacturing a 3D non-volatile memory device, according to an embodiment. FIGS. 6A to 6I are correspond to the 3D non-volatile memory device 10 of FIG. 4. In FIGS. 4 and 6A to 6I, like elements are denoted by like reference numerals, and redundant descriptions thereof are briefly given or omitted.

Figure 6A:
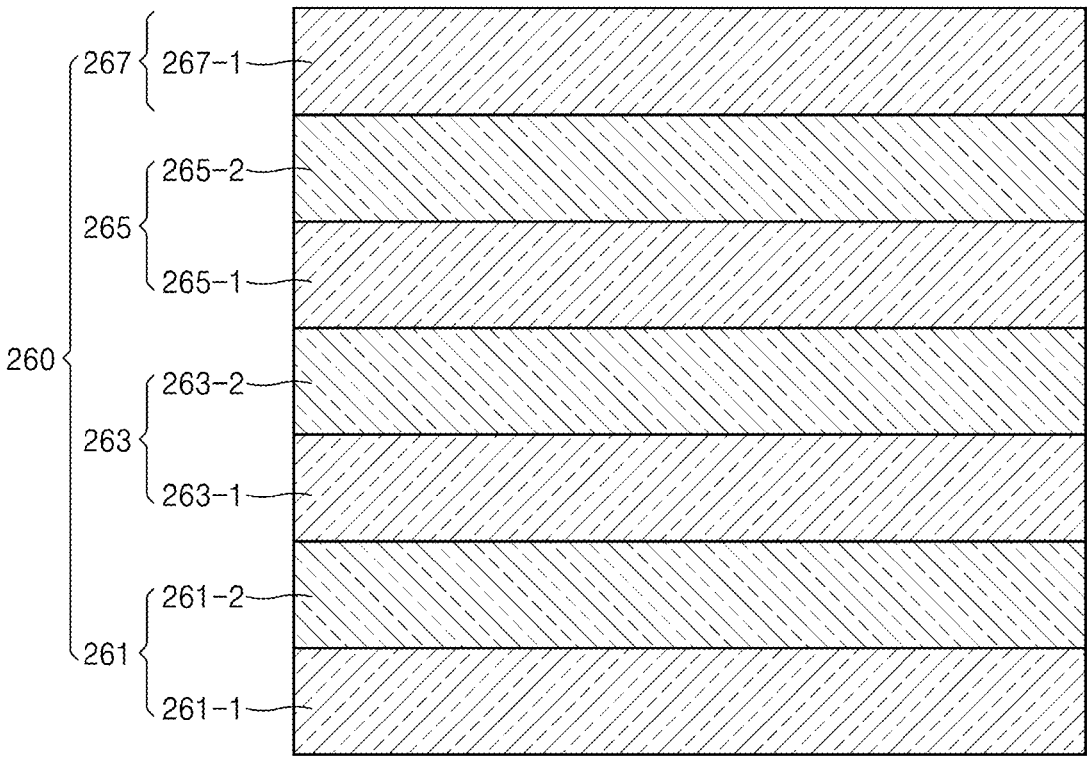
FIGS. 6A to 6I are cross-sectional views of stages in a method of manufacturing a 3D non-volatile memory device, according to an embodiment.

Referring to FIG. 6A, a sacrificial layer 260 may be stacked above the substrate 202 (in FIG. 4). For example, as shown in FIG. 6A, a first sacrificial layer 261, a second sacrificial layer 263, a third sacrificial layer 265, and a fourth sacrificial layer 267 may be sequentially formed above the substrate 202 (in FIG. 4). The first sacrificial layer 261 may include a first lower sacrificial layer 261-1 and a first upper sacrificial layer 261-2, and the second sacrificial layer 263 may include a second lower sacrificial layer 263-1 and a second upper sacrificial layer 263-2. The third sacrificial layer 265 may include a third lower sacrificial layer 265-1 and a third upper sacrificial layer 265-2, and the fourth sacrificial layer 267 may include a fourth lower sacrificial layer 267-1. Although it is illustrated in FIG. 6A that the fourth sacrificial layer 267 includes only the fourth lower sacrificial layer 267-1, the fourth sacrificial layer 267 may also include a fourth upper sacrificial layer. The sacrificial layer 260 may be formed above the substrate 202 (in FIG. 4) by chemical vapor deposition (CVD). For example, the sacrificial layer 260 may include a material that may be easily removed by an annealing process. Alternatively, the sacrificial layer 260 may include a material that may be easily removed by a wet etching process. For example, the first to fourth lower sacrificial layers 261-1, 263-1, 265-1, and 267-1 may include silicon oxide, and the first to third upper sacrificial layers 261-2, 263-2, and 265-2 may include silicon nitride.

Figure 6B:
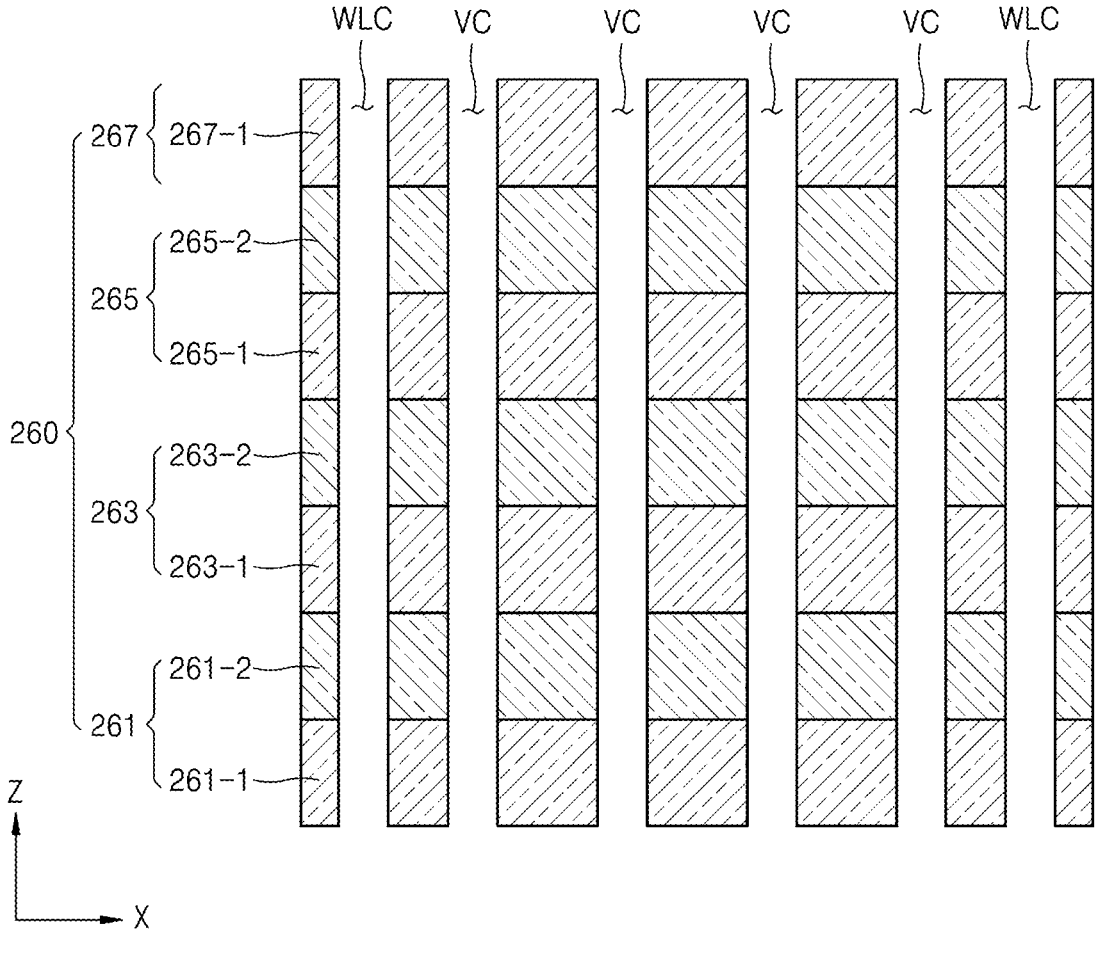

Referring to FIG. 6B, the word line cuts WLC and the through holes VC may be formed to pass through the top and bottom of the sacrificial layer 260, e.g., to extend through the entire thickness of the sacrificial layer 260 in the vertical direction. As an example, it is illustrated in FIG. 6B that four through holes VC are formed between the word line cuts WLC.

Figure 6C:
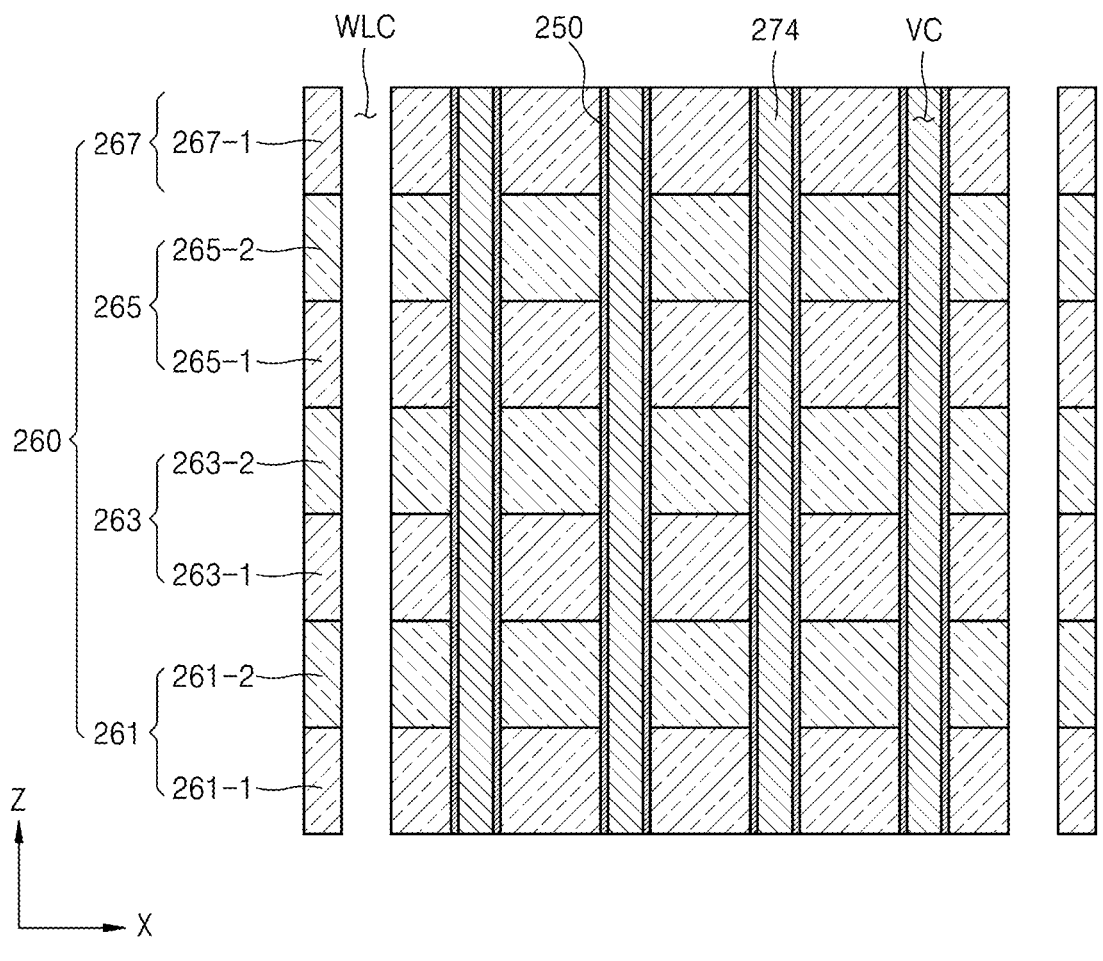

Referring to FIG. 6C, the channel region 250 and the semiconductor pillar 274 may be formed in each of the through holes VC. In a plan view, the channel region 250 may surround the semiconductor pillar 274. The side wall of the channel region 250 may be in contact with the first to third upper sacrificial layers 261-2, 263-2, and 265-2 and the first to fourth lower sacrificial layers 261-1, 263-1, 265-1, and 267-1.

Figure 6D:
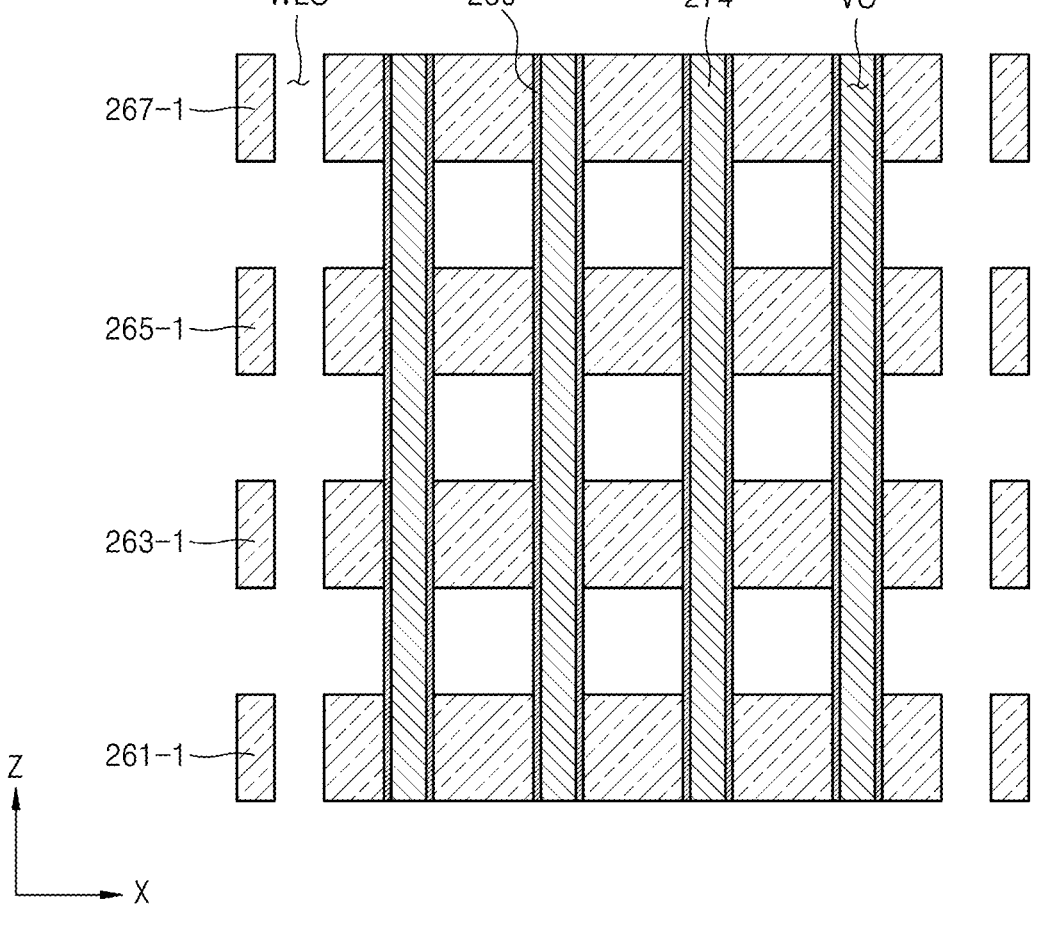

Referring to FIG. 6D, the first to third upper sacrificial layers 261-2, 263-2, and 265-2 may be removed. Accordingly, the side wall of the channel region 250 may be in contact with the first to fourth lower sacrificial layers 261-1, 263-1, 265-1, and 267-1.

Figure 6E:
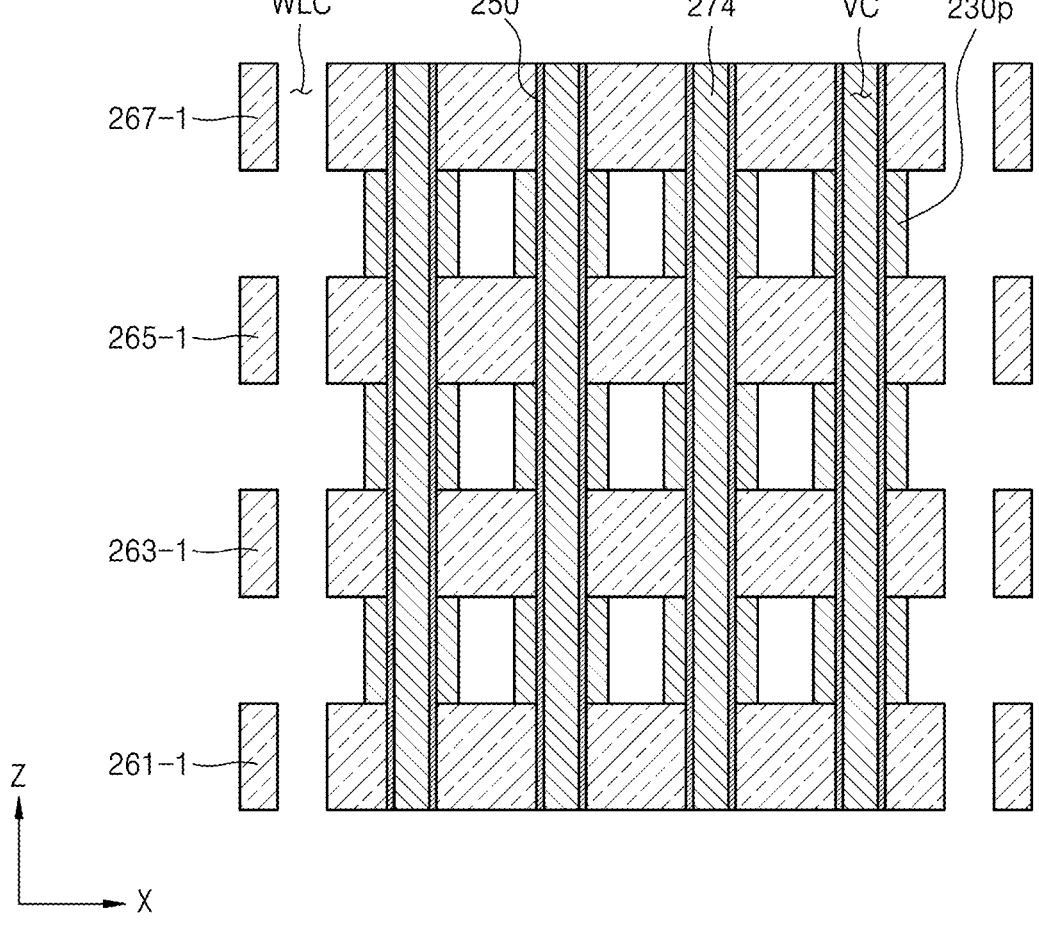

Referring to FIG. 6E, a preliminary vertical insulating pattern 230p may be formed among the first to fourth lower sacrificial layers 261-1, 263-1, 265-1, and 267-1. Accordingly, the side wall of the channel region 250 may be in contact with the first to fourth lower sacrificial layers 261-1, 263-1, 265-1, and 267-1 and the preliminary vertical insulating pattern 230p.

Figure 6F:
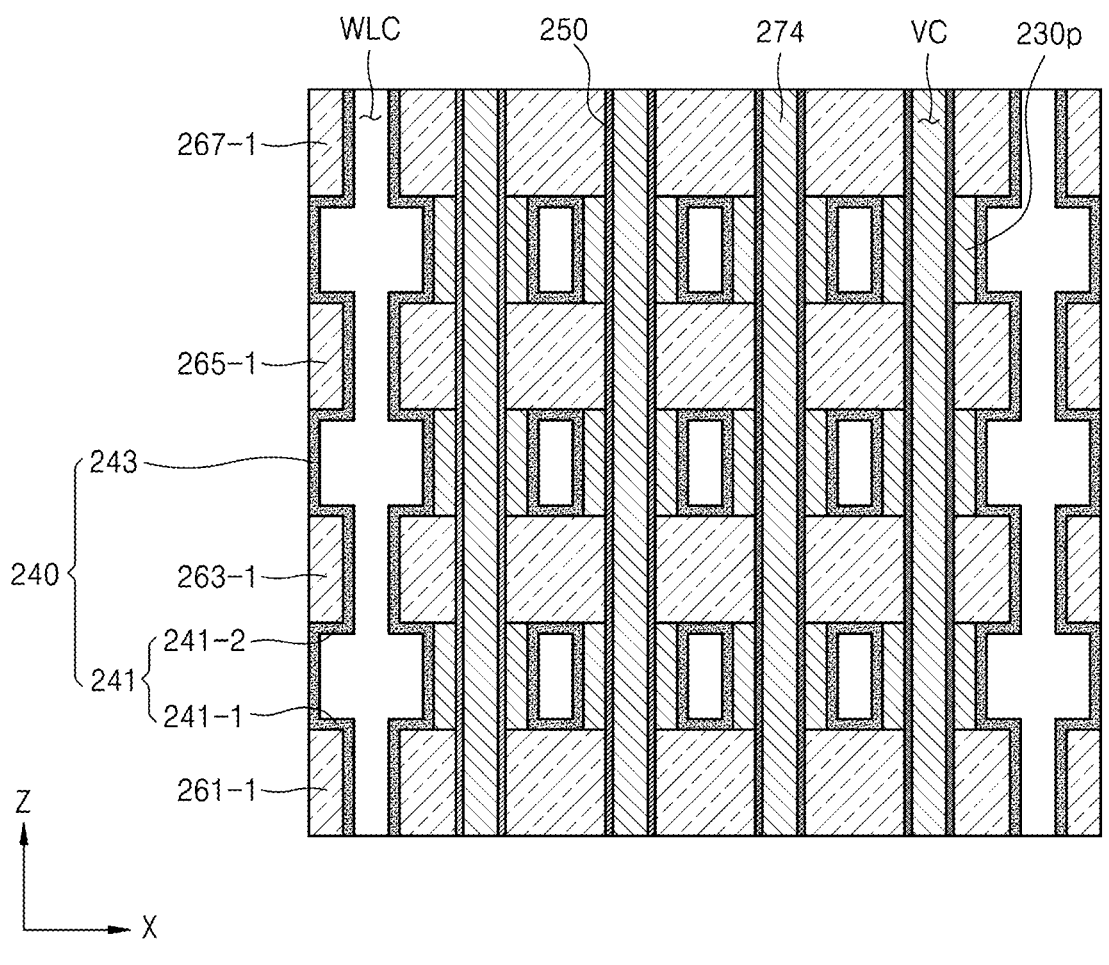

Referring to FIG. 6F, the horizontal ferroelectric layers 241 and the vertical ferroelectric layers 243 may be formed along a side wall of the first to fourth lower sacrificial layers 261-1, 263-1, 265-1, and 267-1 and the preliminary vertical insulating pattern 230p. The horizontal ferroelectric layers 241 may include the lower horizontal ferroelectric layers 241-1 and the upper horizontal ferroelectric layers 241-2. The bottom surface of each of the lower horizontal ferroelectric layers 241-1 may be in contact with the top surface of one of the first to fourth lower sacrificial layers 261-1, 263-1, 265-1, and 267-1, and the top surface of each of the upper horizontal ferroelectric layers 241-2 may be in contact with the bottom surface of one of the first to fourth lower sacrificial layers 261-1, 263-1, 265-1, and 267-1.

The lower horizontal ferroelectric layers 241-1 and the upper horizontal ferroelectric layers 241-2 may be separated from one another in the vertical direction (the Z direction). Afterward, the lower horizontal ferroelectric layers 241-1 may be separated from the upper horizontal ferroelectric layers 241-2 by the air gap AG (in FIG. 6I) in the vertical direction (the Z direction).

Figure 6G:
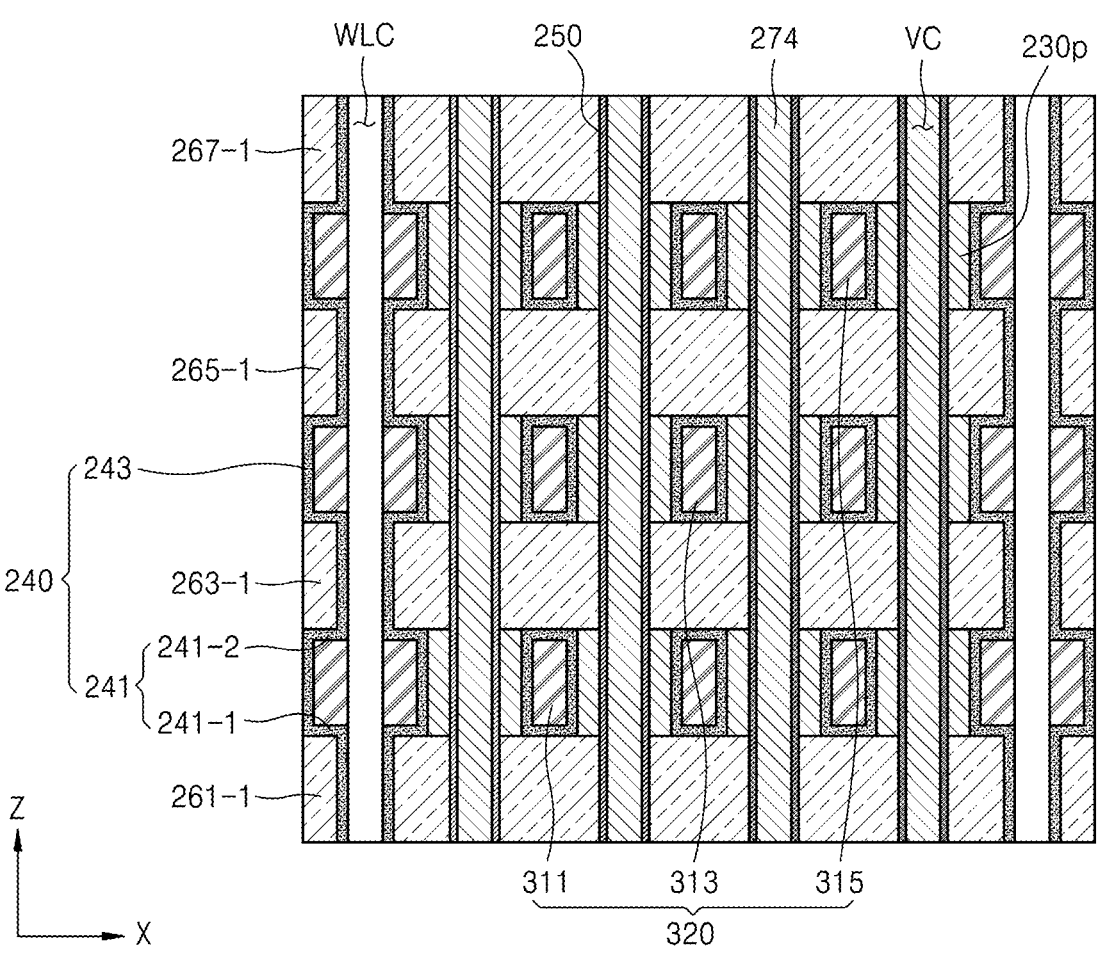

Referring to FIG. 6G, the horizontal word lines 320 may be formed in inner spaces defined by the horizontal ferroelectric layers 241 and the vertical ferroelectric layers 243. The horizontal word lines 320 may include the first to third horizontal word lines 311, 313, and 315. Accordingly, the ferroelectric layers 240 may surround the horizontal word lines 320.

Figure 6H:
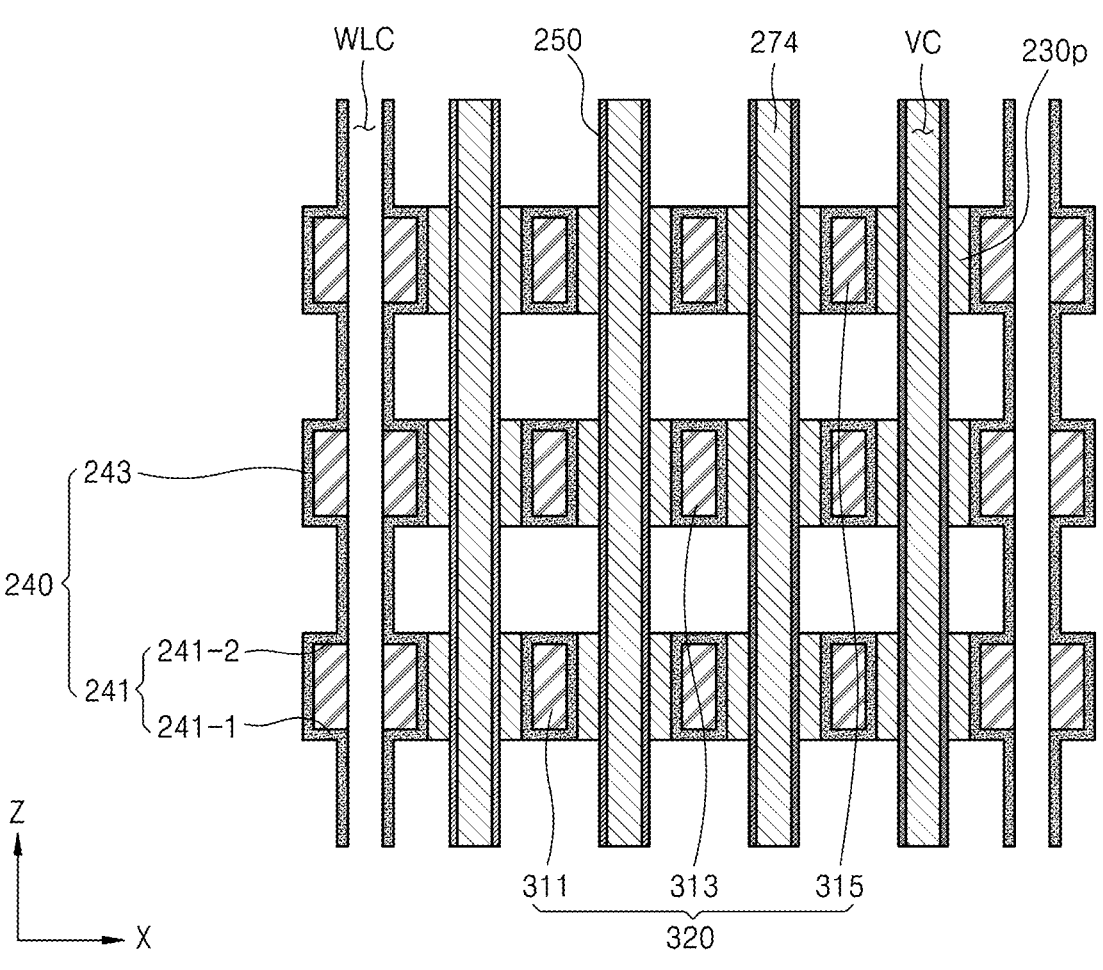

Referring to FIGS. 6G and 6H, the first to fourth lower sacrificial layers 261-1, 263-1, 265-1, and 267-1 may be removed. For example, the first to fourth lower sacrificial layers 261-1, 263-1, 265-1, and 267-1 may be removed by heat. For example, the first to fourth lower sacrificial layers 261-1, 263-1, 265-1, and 267-1 may be heated at a temperature of about 270° C. to about 400° C. to be removed. Accordingly, the side wall of the channel region 250 may be in contact with the preliminary vertical insulating pattern 230p.

Figure 6I:
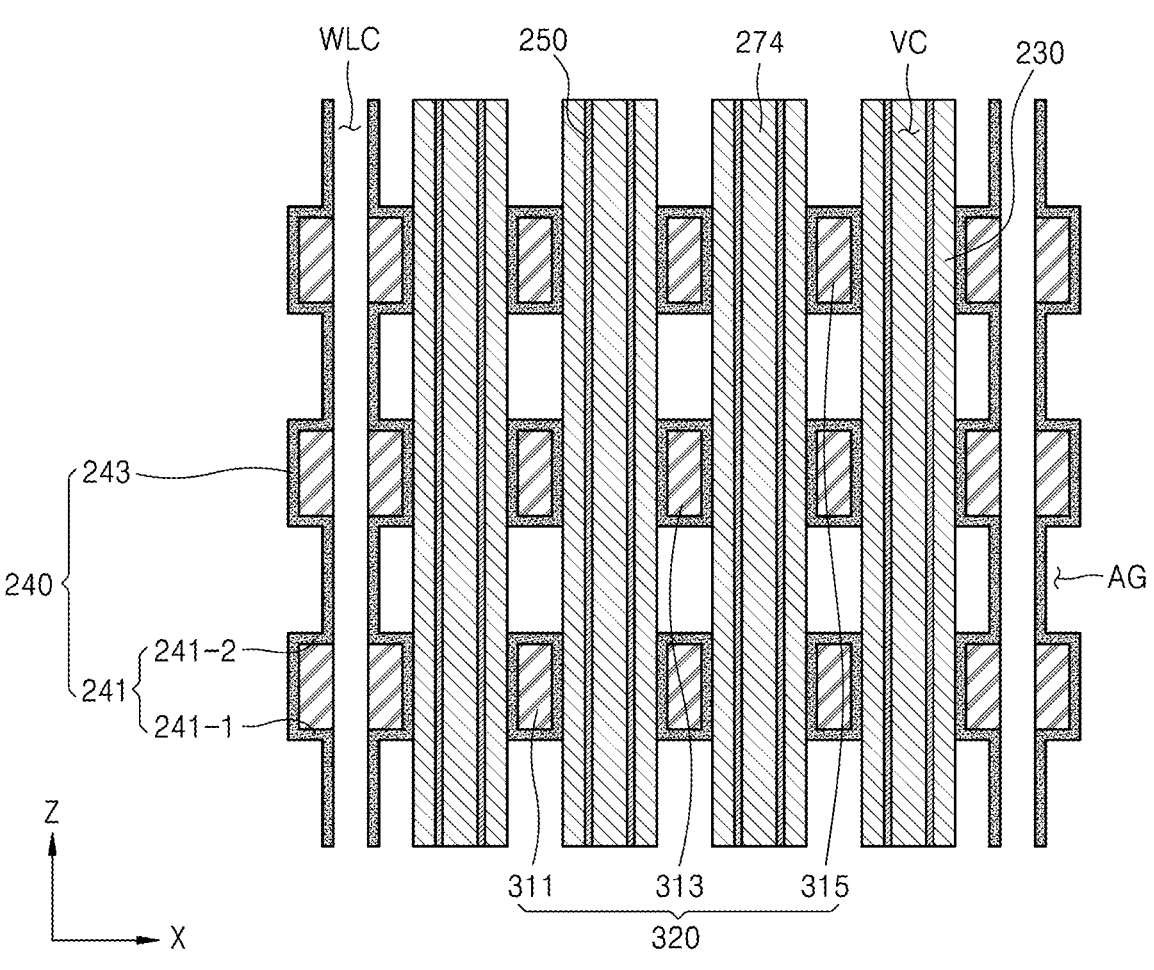

Referring to FIG. 6I, the vertical insulating pattern 230 may be formed. The vertical insulating pattern 230 may be formed between the vertical ferroelectric layers 243 and the channel region 250.

FIGS. 7A to 7I are cross-sectional views of stages in a method of manufacturing a 3D non-volatile memory device, according to an embodiment. FIGS. 7A to 7I are correspond to the 3D non-volatile memory device 10a of FIG. 5. FIGS. 7A to 7I are substantially the same as FIGS. 6A to 6I, with the exception of the horizontal insulating pattern 220. In FIGS. 5 to 7I, like elements are denoted by like reference numerals, and redundant descriptions thereof are briefly given or omitted.

Figure 7A:
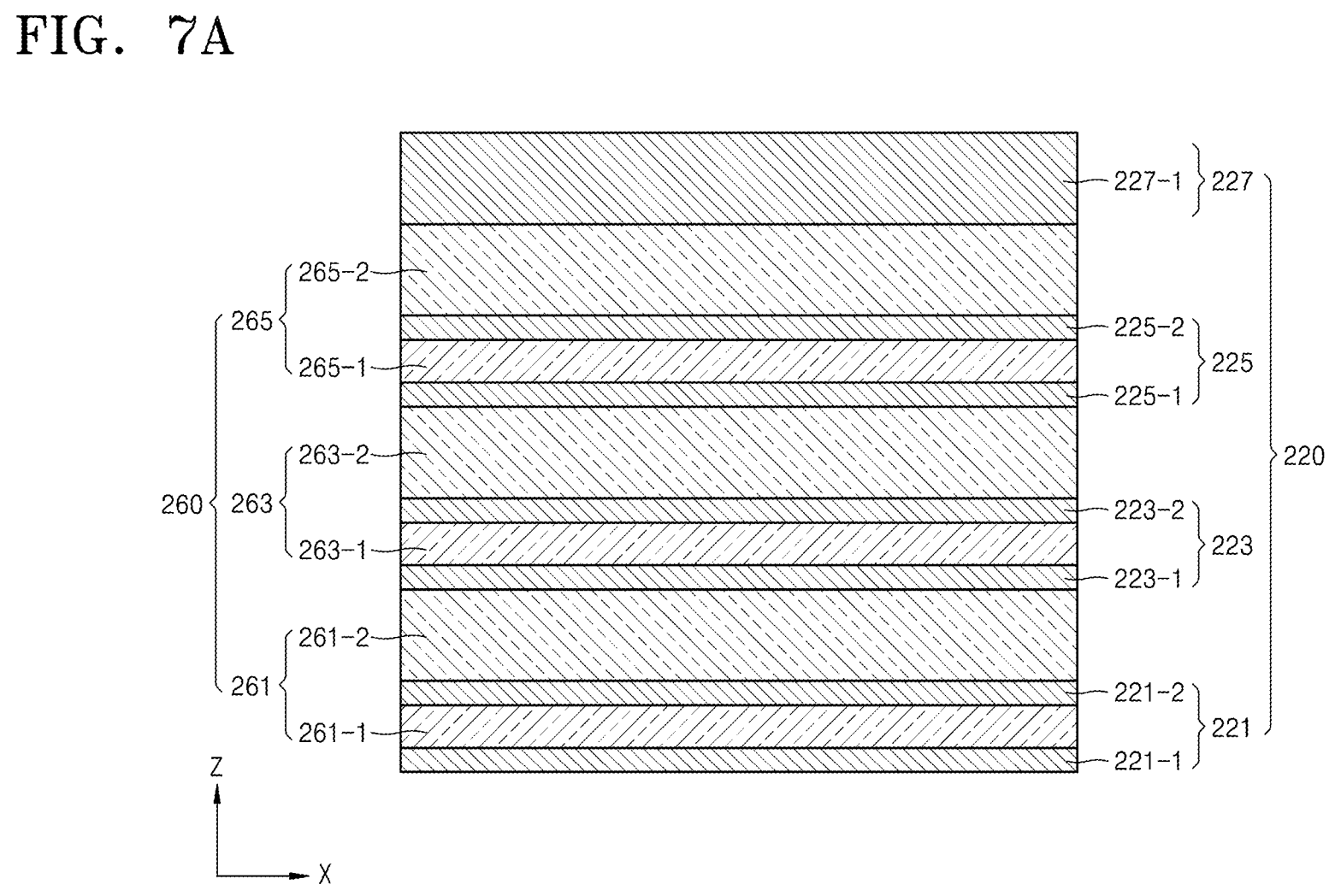

Referring to FIG. 7A, the horizontal insulating pattern 220 and the sacrificial layer 260 may be alternately and repeatedly stacked above the substrate 202 (in FIG. 5). For example, a lower sacrificial layer may be between a lower horizontal insulating pattern and an upper horizontal insulating pattern, and an upper sacrificial layer may be on the upper horizontal insulating pattern. For example, the first lower sacrificial layer 261-1 may be between a first lower horizontal insulating pattern 221-1 and a first upper horizontal insulating pattern 221-2, and the first upper sacrificial layer 261-2 may be on the first upper horizontal insulating pattern 221-2.

The lower horizontal insulating pattern, the lower sacrificial layer, the upper horizontal insulating pattern, and the upper sacrificial layer may be sequentially formed. The horizontal insulating pattern 220 may include first to fourth horizontal insulating patterns 221, 223, 225, and 227. The lower horizontal insulating pattern may include first to fourth lower horizontal insulating patterns 221-1, 223-1, 225-1, and 227-1, and the upper horizontal insulating pattern may include first to third upper horizontal insulating patterns 221-2, 223-2, and 225-2. The sacrificial layer 260 may include first to third sacrificial layer 261, 263, and 265. The lower sacrificial layer may include the first to third lower sacrificial layers 261-1, 263-1, and 265-1, and the upper sacrificial layer may include the first to third upper sacrificial layers 261-2, 263-2, and 265-2. Although it is illustrated in FIG. 7A that a fourth horizontal insulating pattern 227 includes only the fourth lower horizontal insulating pattern 227-1, the fourth horizontal insulating pattern 227 may also include a fourth upper horizontal insulating pattern. The horizontal insulating pattern 220 and the sacrificial layer 260 may be formed above the substrate 202 (in FIG. 5) by CVD. The horizontal insulating pattern 220 may include silicon oxide. The first to third lower sacrificial layers 261-1, 263-1, and 265-1 may include silicon oxide, and the first to third upper sacrificial layers 261-2, 263-2, and 265-2 may include silicon nitride. For example, the sacrificial layer 260 may include a material that may be easily removed by an annealing process. For example, the horizontal insulating pattern 220 may include a material that has an etch selectivity with respect to the sacrificial layer 260. Alternatively, the sacrificial layer 260 may include a material that may be easily removed by a wet etching process.

Figure 7B:
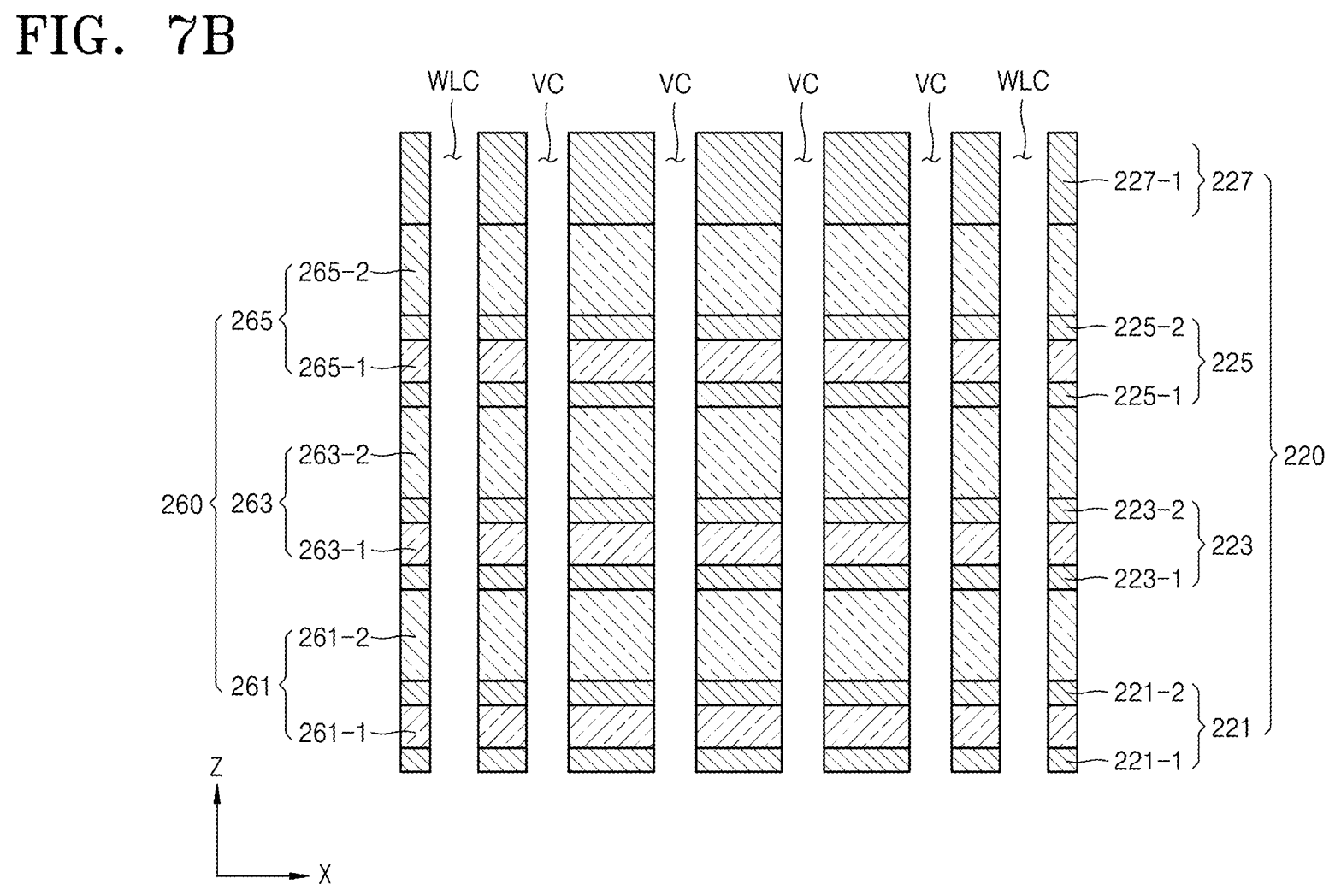

Referring to FIG. 7B, the word line cuts WLC and the through holes VC may be formed to pass through the tops and bottoms of the horizontal insulating pattern 220 and the sacrificial layer 260. As an example, it is illustrated in FIG. 7B that four through holes VC are formed between the word line cuts WLC.

Figure 7C:
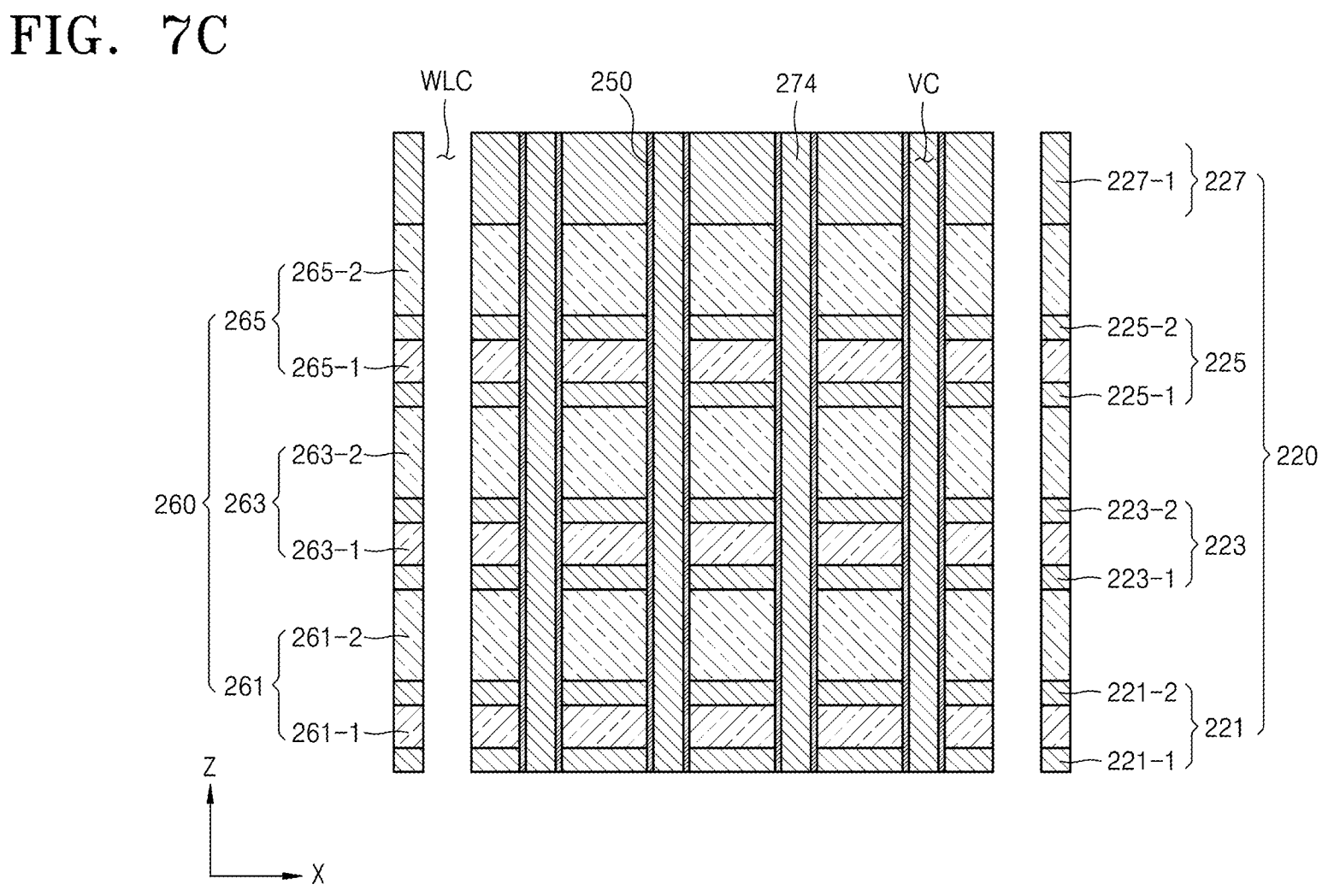

Referring to FIG. 7C, the channel region 250 and the semiconductor pillar 274 may be formed in each of the through holes VC. In a plan view, the channel region 250 may surround the semiconductor pillar 274. The side wall of the channel region 250 may be in contact with the lower horizontal insulating pattern, the lower sacrificial layer, the upper horizontal insulating pattern, and the upper sacrificial layer.

Figure 7D:
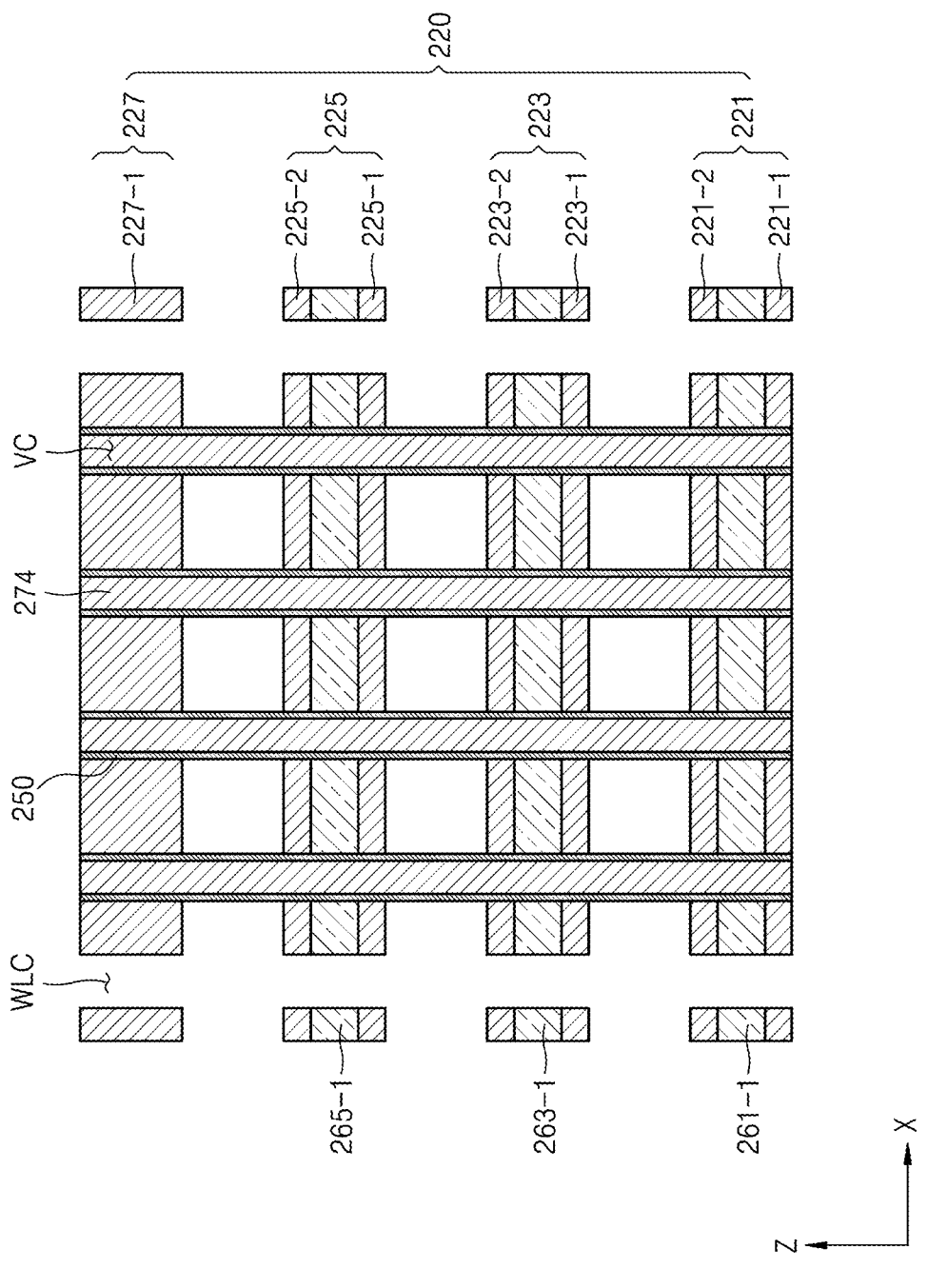

Referring to FIG. 7D, the first to third upper sacrificial layers 261-2, 263-2, and 265-2 may be removed. Accordingly, the side wall of the channel region 250 may be in contact with the lower horizontal insulating pattern, the lower sacrificial layer, and the upper horizontal insulating pattern.

Figure 7E:
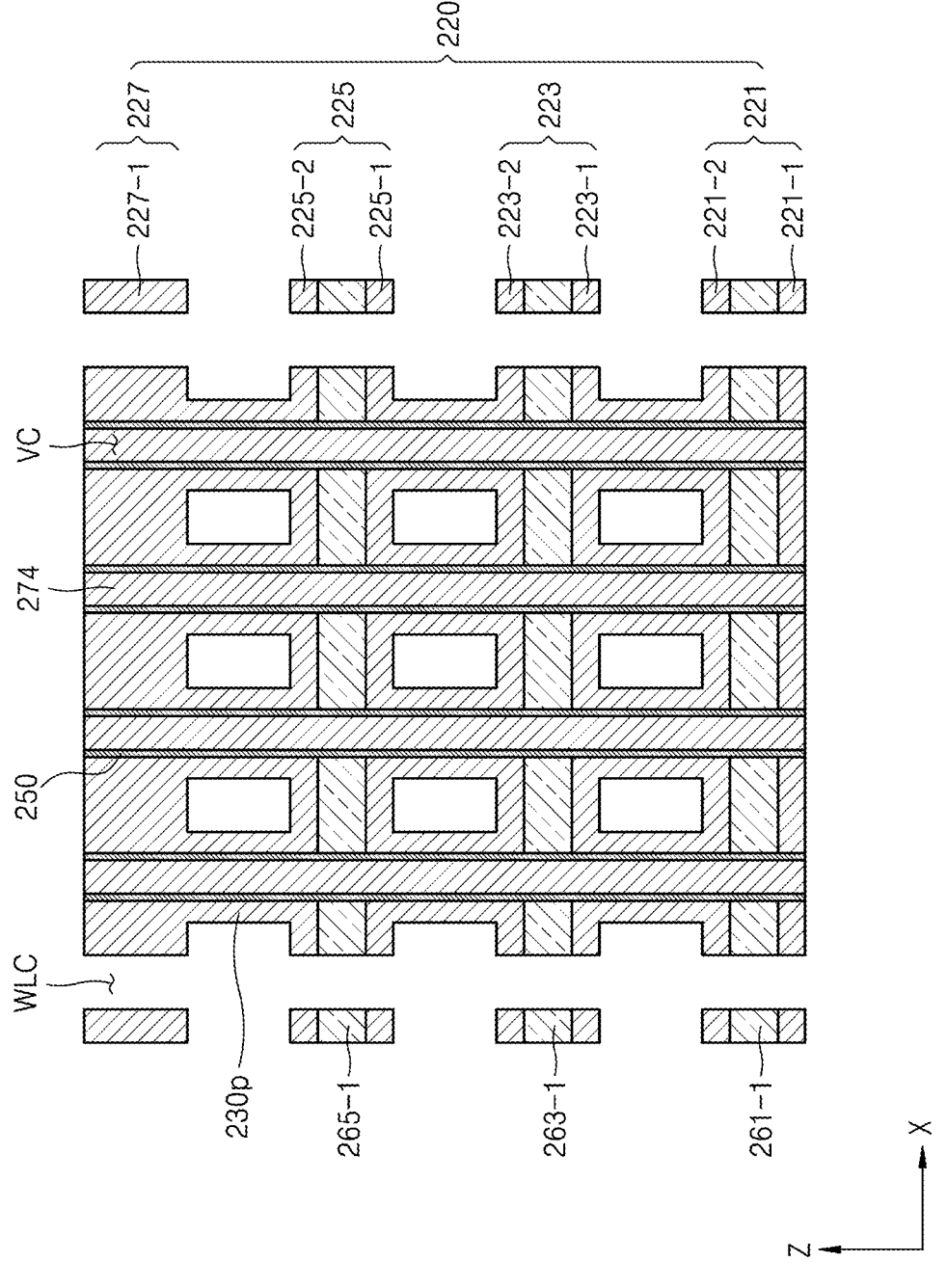

Referring to FIG. 7E, the preliminary vertical insulating pattern 230*p* may be formed between the lower horizontal insulating pattern and the upper horizontal insulating pattern. Accordingly, the side wall of the channel region 250 may be in contact with the lower horizontal insulating pattern, the lower sacrificial layer, the upper horizontal insulating pattern, and the preliminary vertical insulating pattern 230*p*.

Figure 7F:
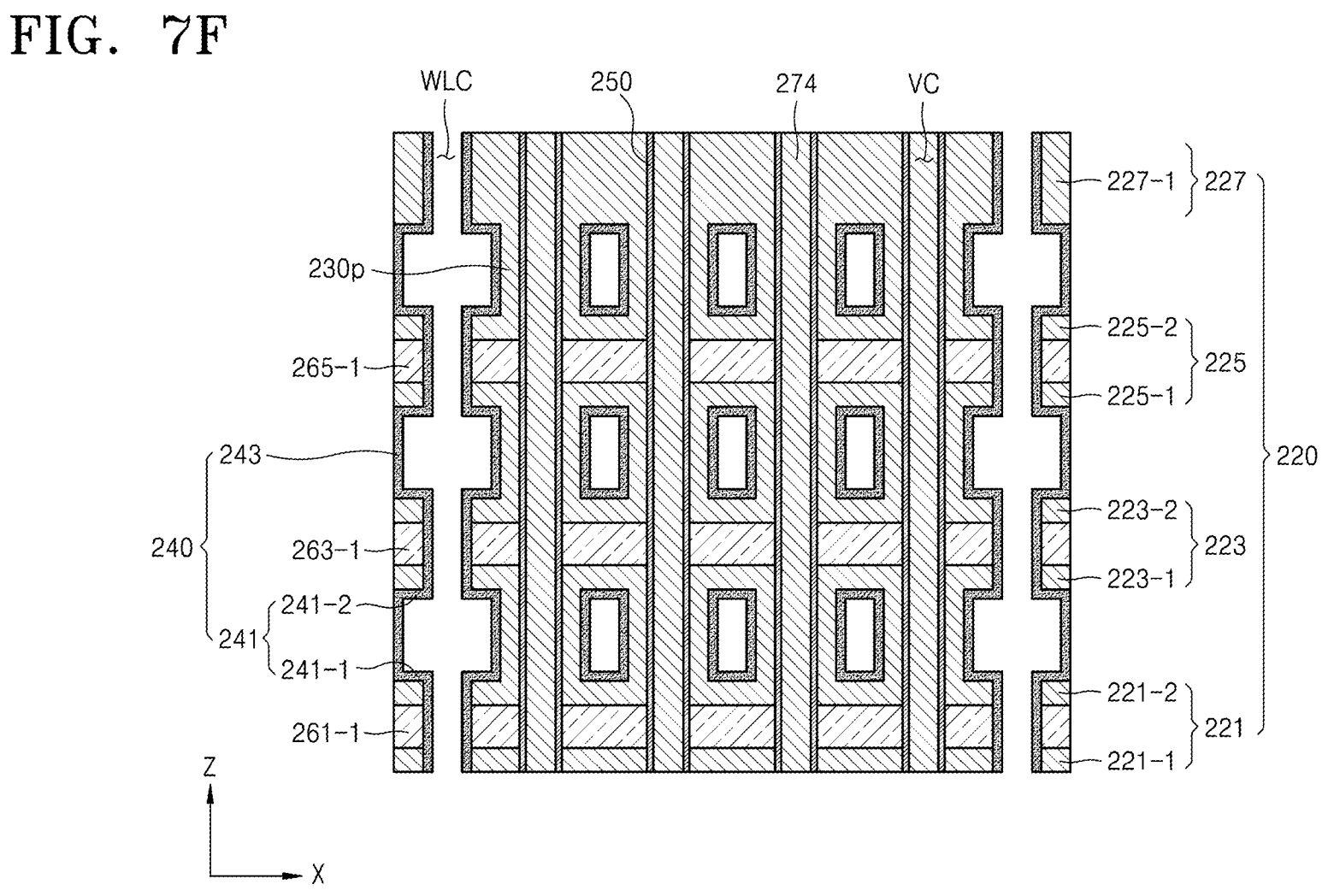

Referring to FIG. 7F, the horizontal ferroelectric layers 241 and the vertical ferroelectric layers 243 may be formed along a side wall of the lower horizontal insulating pattern, the lower sacrificial layer, the upper horizontal insulating pattern, and the preliminary vertical insulating pattern 230*p*. The horizontal ferroelectric layers 241 may include the lower horizontal ferroelectric layers 241-1 and the upper horizontal ferroelectric layers 241-2. The bottom surface of each of the lower horizontal ferroelectric layers 241-1 may be in contact with the top surface of one of the first to third lower horizontal insulating patterns 221-1, 223-1, and 225-1, and the top surface of each of the upper horizontal ferroelectric layers 241-2 may be in contact with the bottom surface of one of the first to third upper horizontal insulating patterns 221-2, 223-2, and 225-2.

Figure 7G:
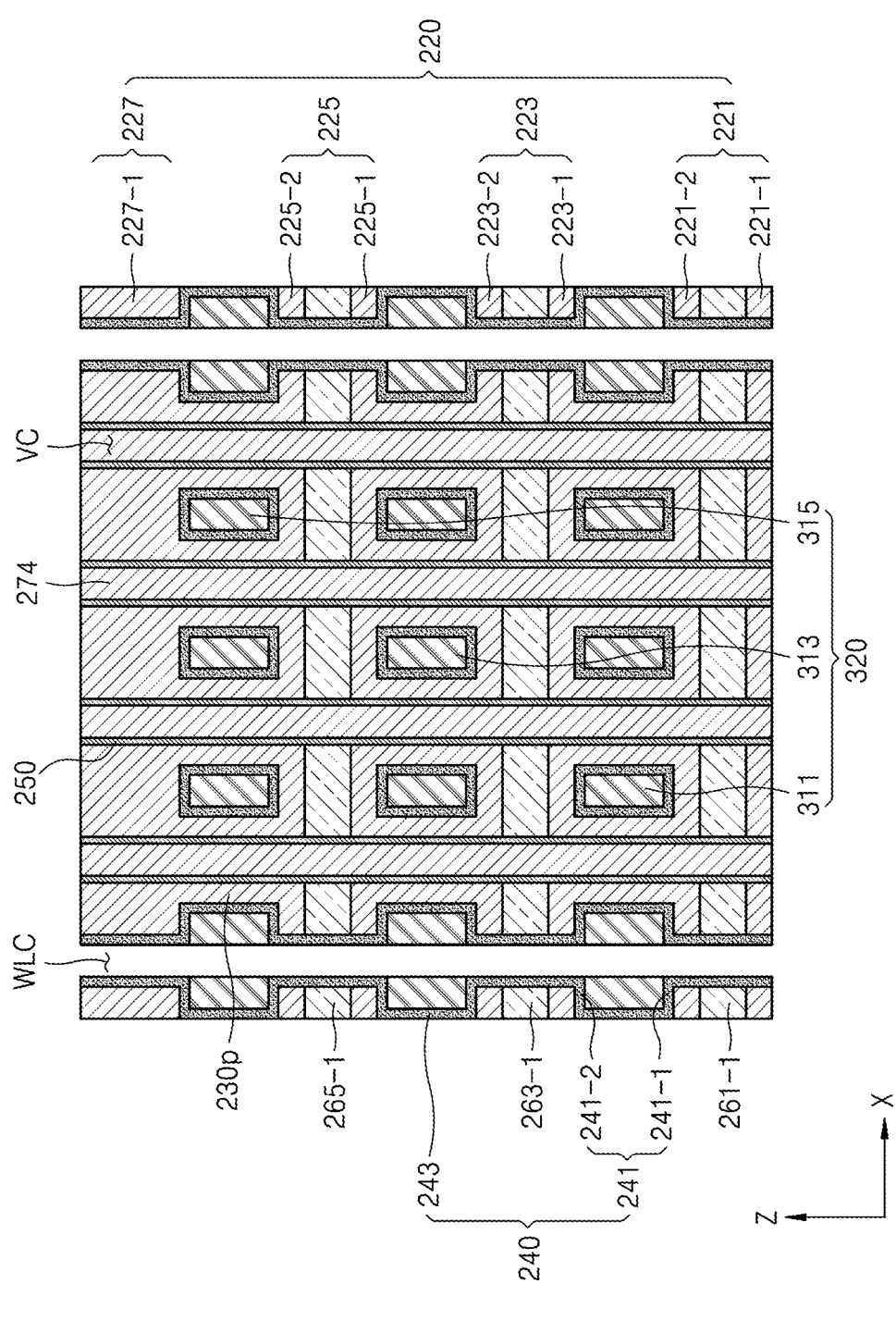

Referring to FIG. 7G, the horizontal word lines 320 may be formed in inner spaces defined by the horizontal ferroelectric layers 241 and the vertical ferroelectric layers 243. The horizontal word lines 320 may include the first to third horizontal word lines 311, 313, and 315. Accordingly, the ferroelectric layers 240 may surround the horizontal word lines 320.

Figure 7H:
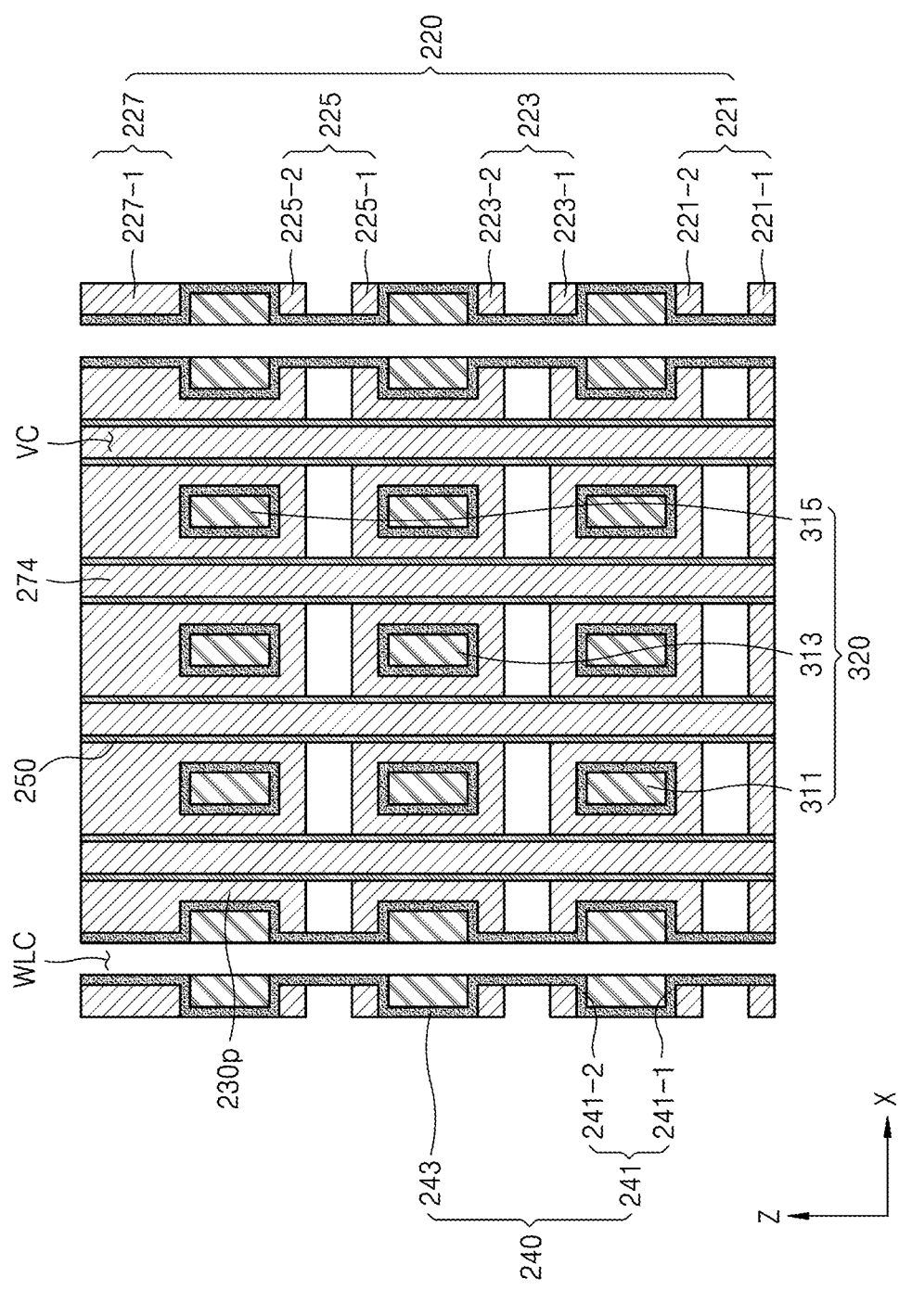

Referring to FIG. 7H, the first to third lower sacrificial layers 261-1, 263-1, and 265-1 may be removed. The first to third lower sacrificial layers 261-1, 263-1, and 265-1 may be removed by heat. For example, the first to third lower sacrificial layers 261-1, 263-1, and 265-1 may be heated at a temperature of about 270 □C to about 400 □C to be removed. Accordingly, the side wall of the channel region 250 may be in contact with the horizontal insulating pattern 220 and the preliminary vertical insulating pattern 230*p*.

The lower horizontal insulating pattern 220-1 and the upper horizontal insulating pattern 220-2 may be separated from each other in the vertical direction (the Z direction). For example, the lower horizontal insulating pattern 220-1 may be separated from the upper horizontal insulating pattern 220-2 by the air gap AG (in FIG. 7I) in the vertical direction (the Z direction).

Figure 7I:
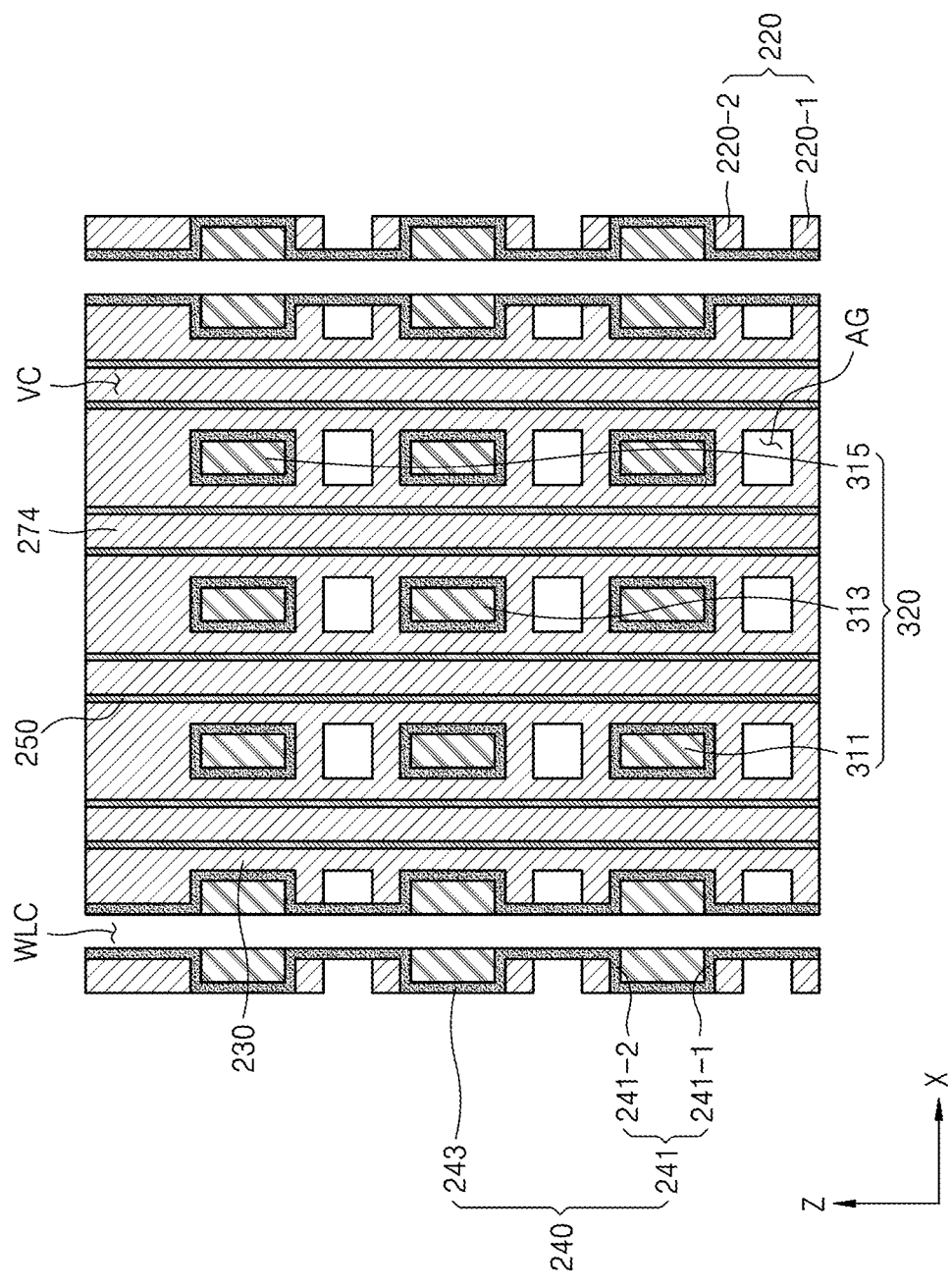

Referring to FIG. 7I, the vertical insulating pattern 230 may be formed. The vertical insulating pattern 230 may be formed between the vertical ferroelectric layers 243 and the channel region 250.

Figure 8:
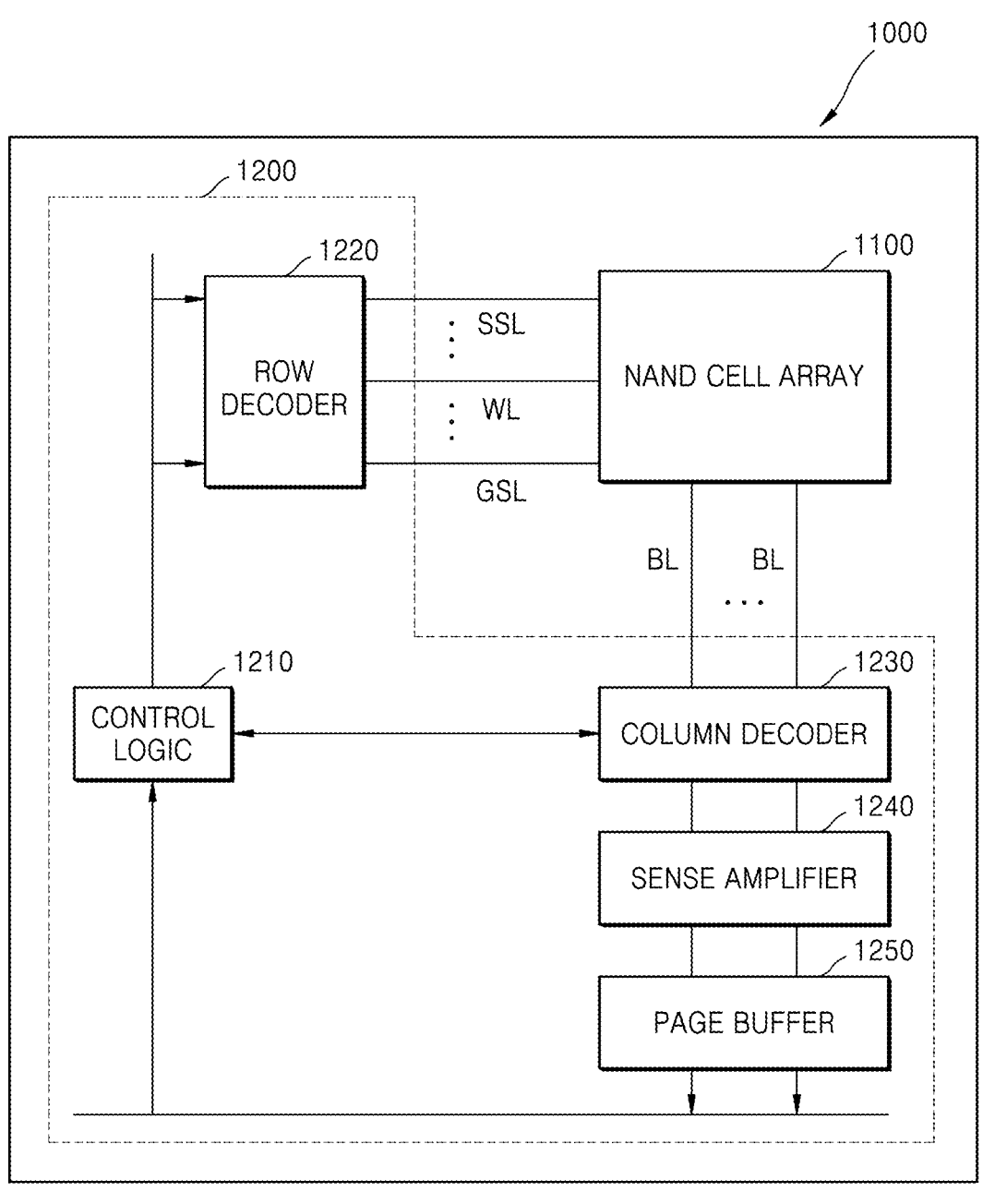
FIG. 8 is a schematic block diagram of a 3D non-volatile memory device according to an embodiment.

FIG. 8 is a schematic block diagram of a 3D non-volatile memory device according to an embodiment.

The 3D non-volatile memory device 1000 may include a NAND cell array 1100 and a core circuit unit 1200. For example, the NAND cell array 1100 may include the 3D non-volatile memory device 10 or 10*a* described above. The core circuit unit 1200 may include a control logic 1210, a row decoder 1220, a column decoder 1230, a sense amplifier 1240, and/or a page buffer 1250.

The control logic 1210 may communicate with the row decoder 1220, the column decoder 1230, and/or the page buffer 1250. The row decoder 1220 may communicate with the NAND cell array 1100, which has a stack structure, through string select lines SSL, word lines WL, and/or ground select lines GSL. The column decoder 1230 may communicate with the NAND cell array 1100 through bit lines BL. The sense amplifier 1240 may be connected to the column decoder 1230 when a signal is output from the NAND cell array 1100 and may not be connected to the column decoder 1230 when a signal is transmitted to the NAND cell array 1100.

For example, the control logic 1210 may transmit a row address signal to the row decoder 1220, and the row decoder 1220 may decode and transmit the row address signal to the NAND cell array 1100 through the string select lines SSL, the word lines WL, and the ground select lines GSL. The control logic 1210 may transmit a column address signal to the column decoder 1230 or the page buffer 1250, and the column decoder 1230 may decode and transmit the column address signal to the NAND cell array 1100 through the bit lines BL. A signal of the NAND cell array 1100 may be transmitted to the sense amplifier 1240 through the column decoder 1230, then amplified by the sense amplifier 1240, and then transmitted to the control logic 1210 through the page buffer 1250.

Figure 9:
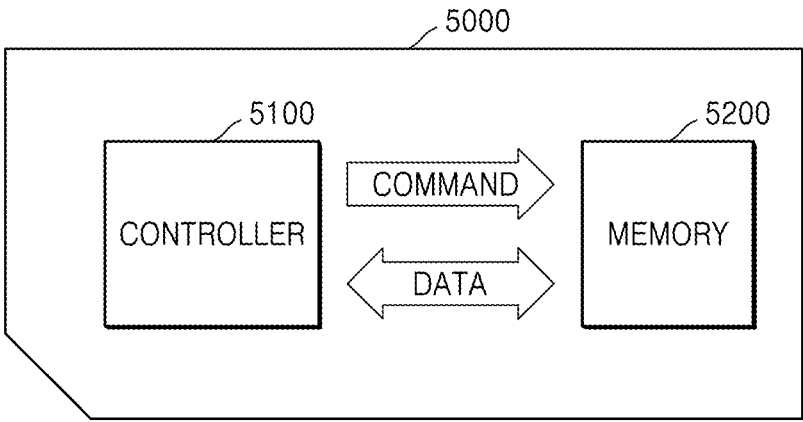
FIG. 9 is a schematic diagram of a card according to an embodiment.

FIG. 9 is a schematic diagram of a card according to an embodiment.

The card 5000 may include a controller 5100 and a memory 5200. The controller 5100 and the memory 5200 may be arranged so as to exchange electrical signals with each other. For example, when the controller 5100 transmits a command to the memory 5200, the memory 5200 may transmit data to the controller 5100. The memory 5200 may include a 3D non-volatile memory device according to one of the embodiments.

According to various embodiments, 3D non-volatile memory devices may be arranged as a NAND or NOR architecture memory array in correspondence to NAND or NOR logic gate design. The card 5000 may be used in memory devices like various cards, e.g., a memory stick card, a smart media (SM) card, a secure digital (SD) card, a mini SD card, and a multimedia card (MMC).

Figure 10:
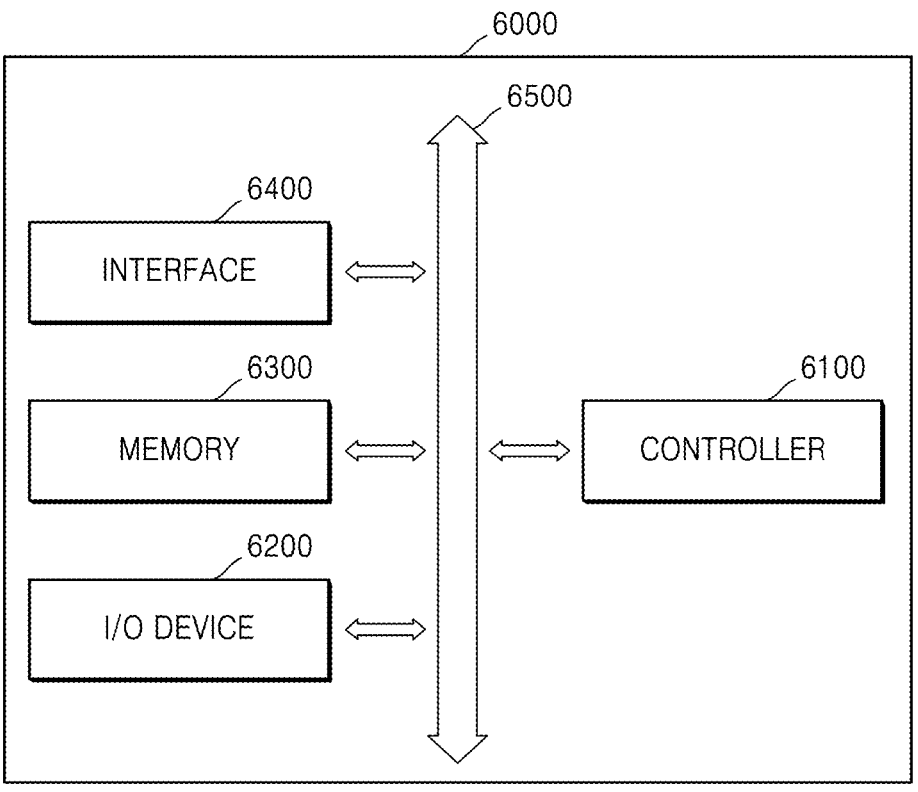
FIG. 10 is a schematic diagram of a system according to an embodiment.

FIG. 10 is a schematic diagram of a system 6000 according to an embodiment.

The system 6000 may include a controller 6100, an input/output (I/O) device 6200, a memory 6300, and an interface 6400. The system 6000 may include a mobile system or a system transmitting or receiving information. The mobile system may include a personal digital assistant (PDA), a portable computer, a web tablet, a wireless phone, a mobile phone, a digital music player, or a memory card.

The controller 6100 may execute a program and control the system 6000. For example, the controller 6100 may correspond to a microprocessor, a digital signal processor, a microcontroller, or the like. The I/O device 6200 may be used for data input or output of the system 6000. The system 6000 may connect to and exchange data with an external device, e.g., a personal computer (PC) or a network, using the I/O device 6200. For example, the I/O device 6200 may include a keypad, a keyboard, or a display.

The memory 6300 may store code and/or data for the operation of the controller 6100 and/or store data that has been processed by the controller 6100. The memory 6300 may include a 3D non-volatile memory device according to one of the embodiments. The interface 6400 may correspond to a data transmission passage between the system 6000 and an external device. The controller 6100, the I/O device 6200, the memory 6300, and the interface 6400 may communicate with one another through a bus 6500.

For example, the system 6000 may be used in a mobile phone, an MP3 player, a navigation device, a portable multimedia player (PMP), a solid state disk (SSD), or household appliances.

By way of summation and review, embodiments provide a three-dimensional non-volatile memory device having a structure favorable for the miniaturization and high integration density of the three-dimensional non-volatile memory device and having the reliability between cell transistors.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A three-dimensional non-volatile memory device, comprising:
horizontal word lines separated from each other in a vertical direction;
horizontal ferroelectric layers arranged among the horizontal word lines, the horizontal ferroelectric layers including upper horizontal ferroelectric layers and lower horizontal ferroelectric layers, the upper horizontal ferroelectric layers and the lower horizontal ferroelectric layers being separated from each other by an air gap in the vertical direction;
vertical ferroelectric layers contacting the horizontal ferroelectric layers and extending in the vertical direction;
a semiconductor pillar passing through the horizontal word lines in the vertical direction; and
a channel region between the horizontal word lines and the semiconductor pillar.

2. The three-dimensional non-volatile memory device as claimed in claim 1, wherein top and bottom surfaces of the horizontal word lines are in contact with the horizontal ferroelectric layers.

3. The three-dimensional non-volatile memory device as claimed in claim 1, wherein the horizontal ferroelectric layers and the vertical ferroelectric layers surround the horizontal word lines.

4. The three-dimensional non-volatile memory device as claimed in claim 1, further comprising vertical insulating patterns between the vertical ferroelectric layers and the channel region.

5. The three-dimensional non-volatile memory device as claimed in claim 4, wherein at least some of the vertical ferroelectric layers are separated from the vertical insulating patterns by the air gap in a horizontal direction.

6. The three-dimensional non-volatile memory device as claimed in claim 1, wherein the vertical ferroelectric layers are arranged to zigzag in the vertical direction.

7. A three-dimensional non-volatile memory device, comprising:
horizontal word lines separated from each other in a vertical direction;
horizontal ferroelectric layers arranged among the horizontal word lines, the horizontal ferroelectric layers including upper horizontal ferroelectric layers and lower horizontal ferroelectric layers;
vertical ferroelectric layers contacting the horizontal ferroelectric layers and extending in the vertical direction;
horizontal insulating patterns arranged among the horizontal ferroelectric layers, the horizontal insulating patterns including upper horizontal insulating patterns and lower horizontal insulating patterns, and the upper horizontal insulating patterns and the lower horizontal insulating patterns being separated from each other by an air gap in the vertical direction;
a semiconductor pillar passing through the horizontal word lines in the vertical direction;
a channel region between the horizontal word lines and the semiconductor pillar; and
vertical insulating patterns between the vertical ferroelectric layers and the channel region.

8. The three-dimensional non-volatile memory device as claimed in claim 7, wherein:
top surfaces of the lower horizontal ferroelectric layers are respectively in contact with bottom surfaces of the horizontal word lines, and
bottom surfaces of the lower horizontal ferroelectric layers are respectively in contact with top surfaces of the upper horizontal insulating patterns.

9. The three-dimensional non-volatile memory device as claimed in claim 7, wherein a side wall of the vertical insulating patterns is in contact with side walls of the horizontal ferroelectric layers and side walls of the horizontal insulating patterns.

10. The three-dimensional non-volatile memory device as claimed in claim 7, wherein at least some portions of the vertical insulating patterns are separated from each other by the air gap in a horizontal direction.

11. The three-dimensional non-volatile memory device as claimed in claim 7, wherein at least some of the vertical ferroelectric layers are separated from the vertical insulating pattern by the air gap in a horizontal direction.

12. The three-dimensional non-volatile memory device as claimed in claim 7, wherein the horizontal ferroelectric layers are electrically connected with the vertical ferroelectric layers.

13. A three-dimensional non-volatile memory device, comprising:
a substrate having a main surface;
horizontal word lines above the substrate, the horizontal word lines extending in a horizontal direction and being separated from each other in a vertical direction, the horizontal direction being parallel with the main surface of the substrate, and the vertical direction being perpendicular to the main surface of the substrate;
horizontal insulating patterns extending in the horizontal direction;
horizontal ferroelectric layers extending in the horizontal direction above the substrate, the horizontal ferroelectric layers being arranged among the horizontal word lines and including upper horizontal ferroelectric layers and lower horizontal ferroelectric layers, and the upper horizontal ferroelectric layers and the lower horizontal ferroelectric layers being separated from each other by an air gap in the vertical direction;
vertical ferroelectric layers contacting the horizontal ferroelectric layers, extending in the vertical direction, and connecting with the horizontal ferroelectric layers;
a word line cut passing through the horizontal word lines in the vertical direction;

a through hole separated from the word line cut in the horizontal direction, the through hole including a semiconductor pillar passing through the horizontal word lines in the vertical direction and a channel region between the horizontal word lines and the semiconductor pillar; and vertical insulating patterns between the horizontal word lines and the through hole.

14. The three-dimensional non-volatile memory device as claimed in claim 13, further comprising horizontal insulating patterns arranged among the horizontal ferroelectric layers, the horizontal insulating patterns including upper horizontal insulating patterns and lower horizontal insulating patterns separated from the upper horizontal insulating patterns by the air gap in the vertical direction.

15. The three-dimensional non-volatile memory device as claimed in claim 14, wherein the vertical ferroelectric layers are in contact with side walls of the horizontal insulating patterns and separated from the vertical insulating patterns by the air gap in the horizontal direction.

16. The three-dimensional non-volatile memory device as claimed in claim 14, wherein side walls of the vertical ferroelectric layers are in contact with side walls of the horizontal word lines or side walls of the horizontal insulating patterns.

17. The three-dimensional non-volatile memory device as claimed in claim 13, wherein:

top surfaces of the horizontal word lines are respectively in contact with bottom surfaces of the upper horizontal ferroelectric layers, and bottom surfaces of the horizontal word lines are respectively in contact with top surfaces of the lower horizontal ferroelectric layers.

18. The three-dimensional non-volatile memory device as claimed in claim 13, wherein a plurality of vertical insulating patterns between neighboring through holes are separated from each other by the air gap in the horizontal direction.

19. The three-dimensional non-volatile memory device as claimed in claim 13, wherein some of the vertical ferroelectric layers are in the word line cut and electrically connected to each other by some of the horizontal ferroelectric layers and others of the vertical ferroelectric layers, the some of the horizontal ferroelectric layers contacting a side wall of the word line cut, and the others of the vertical ferroelectric layers contacting the vertical insulating patterns.

20. The three-dimensional non-volatile memory device as claimed in claim 13, wherein a thickness of the air gap in the vertical direction is less than or equal to about 15 nm.

* * * * *